United States Patent
Maejima et al.

(10) Patent No.: US 7,898,851 B2
(45) Date of Patent: Mar. 1, 2011

(54) SEMICONDUCTOR MEMORY DEVICE WHICH INCLUDES MEMORY CELL HAVING CHARGE ACCUMULATION LAYER AND CONTROL GATE

(75) Inventors: Hiroshi Maejima, Milpitas, CA (US); Makoto Hamada, Mountain View, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 343 days.

(21) Appl. No.: 11/960,158

(22) Filed: Dec. 19, 2007

(65) Prior Publication Data
US 2009/0159949 A1 Jun. 25, 2009

(51) Int. Cl.
*G11C 11/34* (2006.01)
*G11C 7/00* (2006.01)

(52) U.S. Cl. .......................... 365/185.03; 365/185.17; 365/185.18; 365/185.23; 365/189.11; 365/230.06

(58) Field of Classification Search ............ 365/185.03, 365/185.17, 185.18, 185.23, 185.26, 185.27, 365/185.29, 185.33, 230.06
See application file for complete search history.

(56) References Cited

U.S. PATENT DOCUMENTS

| | | | | |
|---|---|---|---|---|
| 5,706,241 A * | 1/1998 | Nakamura et al. | ...... | 365/185.17 |
| 6,026,047 A * | 2/2000 | Ryu et al. | ...... | 365/185.23 |
| 6,075,723 A * | 6/2000 | Naiki et al. | ...... | 365/185.03 |
| 6,212,095 B1 * | 4/2001 | Chevallier | ...... | 365/230.06 |
| 6,774,704 B2 * | 8/2004 | Kushnarenko | ...... | 327/530 |
| 6,853,029 B2 | 2/2005 | Ichige | | |
| 7,009,881 B2 * | 3/2006 | Noguchi | ...... | 365/185.17 |
| 7,045,423 B2 | 5/2006 | Ichige | | |
| 7,224,616 B2 * | 5/2007 | Kim et al. | ...... | 365/185.23 |
| 7,339,828 B2 * | 3/2008 | Hasegawa et al. | ...... | 365/185.18 |
| 7,477,543 B2 * | 1/2009 | Choi | ...... | 365/185.03 |
| 7,505,355 B2 | 3/2009 | Kanda | | |
| 7,518,921 B2 * | 4/2009 | Maejima et al. | ...... | 365/185.17 |
| 7,630,242 B2 * | 12/2009 | Taito et al. | ...... | 365/185.23 |
| 7,630,244 B2 * | 12/2009 | Lee | ...... | 365/185.17 |
| 7,636,259 B1 * | 12/2009 | McLaury et al. | ...... | 365/185.23 |
| 7,639,540 B2 * | 12/2009 | Kim et al. | ...... | 365/185.18 |
| 7,643,340 B2 * | 1/2010 | Kong et al. | ...... | 365/185.23 |
| 7,643,358 B2 * | 1/2010 | Nakagawa et al. | ...... | 365/185.23 |
| 7,652,928 B2 * | 1/2010 | Yanagidaira et al. | ... | 365/185.23 |

FOREIGN PATENT DOCUMENTS

| | | |
|---|---|---|
| JP | 2003-86720 | 3/2003 |
| JP | 2006-114139 | 4/2006 |

* cited by examiner

*Primary Examiner*—Trong Phan
(74) *Attorney, Agent, or Firm*—Oblon, Spivak, McClelland, Maier & Neustadt, L.L.P.

(57) ABSTRACT

A semiconductor memory device includes a memory cell unit, word lines, a driver circuit, and a voltage generator. In the memory cell unit, memory cells having a charge accumulation layer and a control gate are connected in series. The word lines are connected to the control gates. The driver circuit selects the word lines. The voltage generator generates a first voltage and a second voltage lower than the first voltage. The first voltage is used by the first driver circuit to transfer a voltage to the unselected word line. The second voltage is used by circuits other than the first driver circuit.

6 Claims, 13 Drawing Sheets

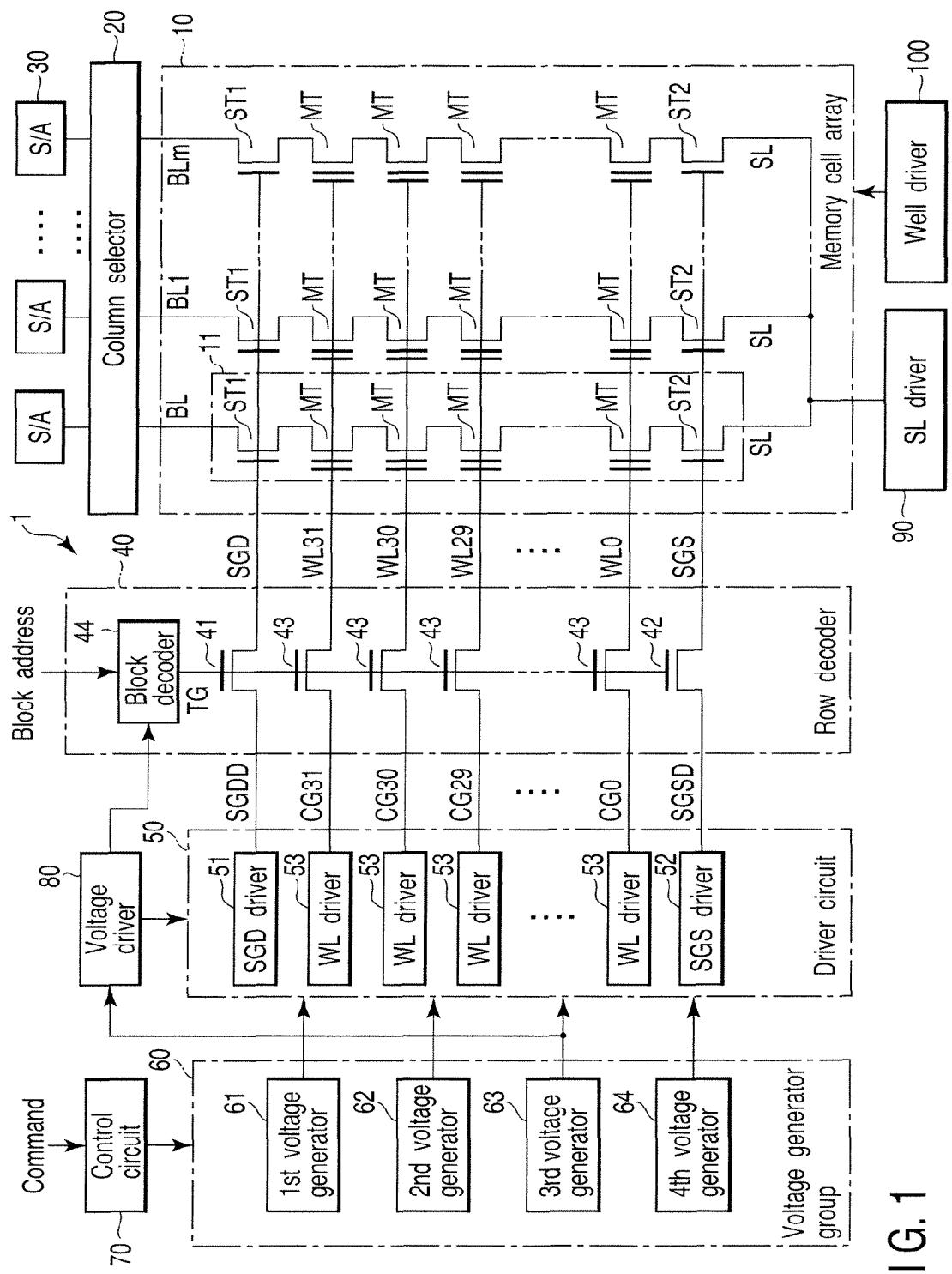
F I G. 1

Threshold voltage Vth

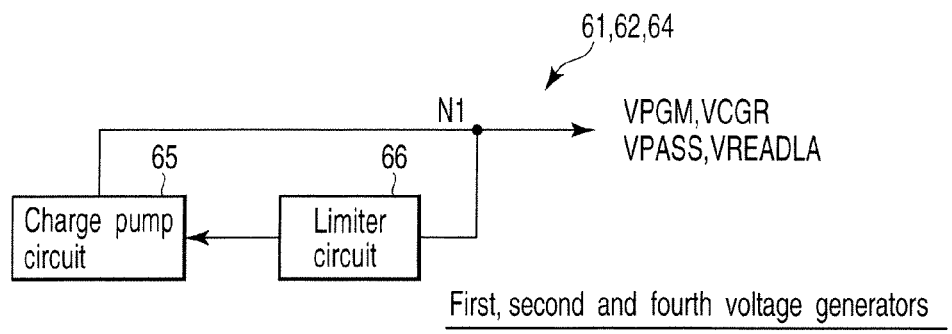
FIG. 4
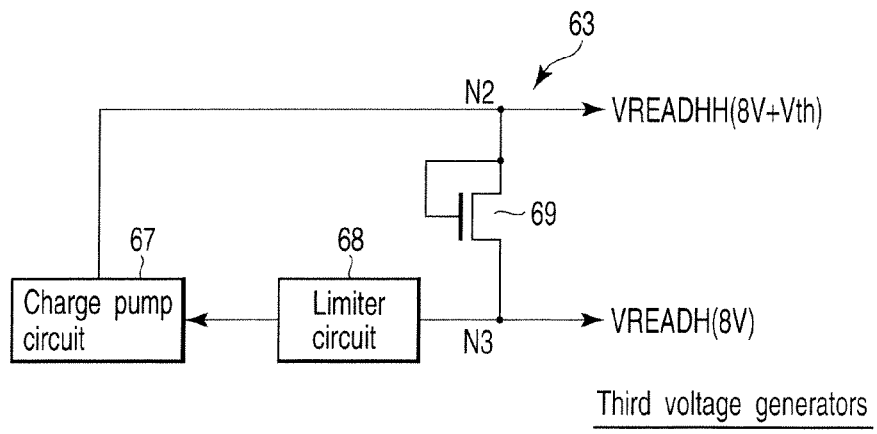
FIG. 5
|  | Program | Read |
|---|---|---|
| First voltage generator | VPASS | VREADLA |
| Second voltage generator | VPASS | VREAD |
| Third voltage generator | VREADHH / VREADH | VREADHH / VREADH |
| Fourth voltage generator | VPGM | VCGR |
FIG. 6

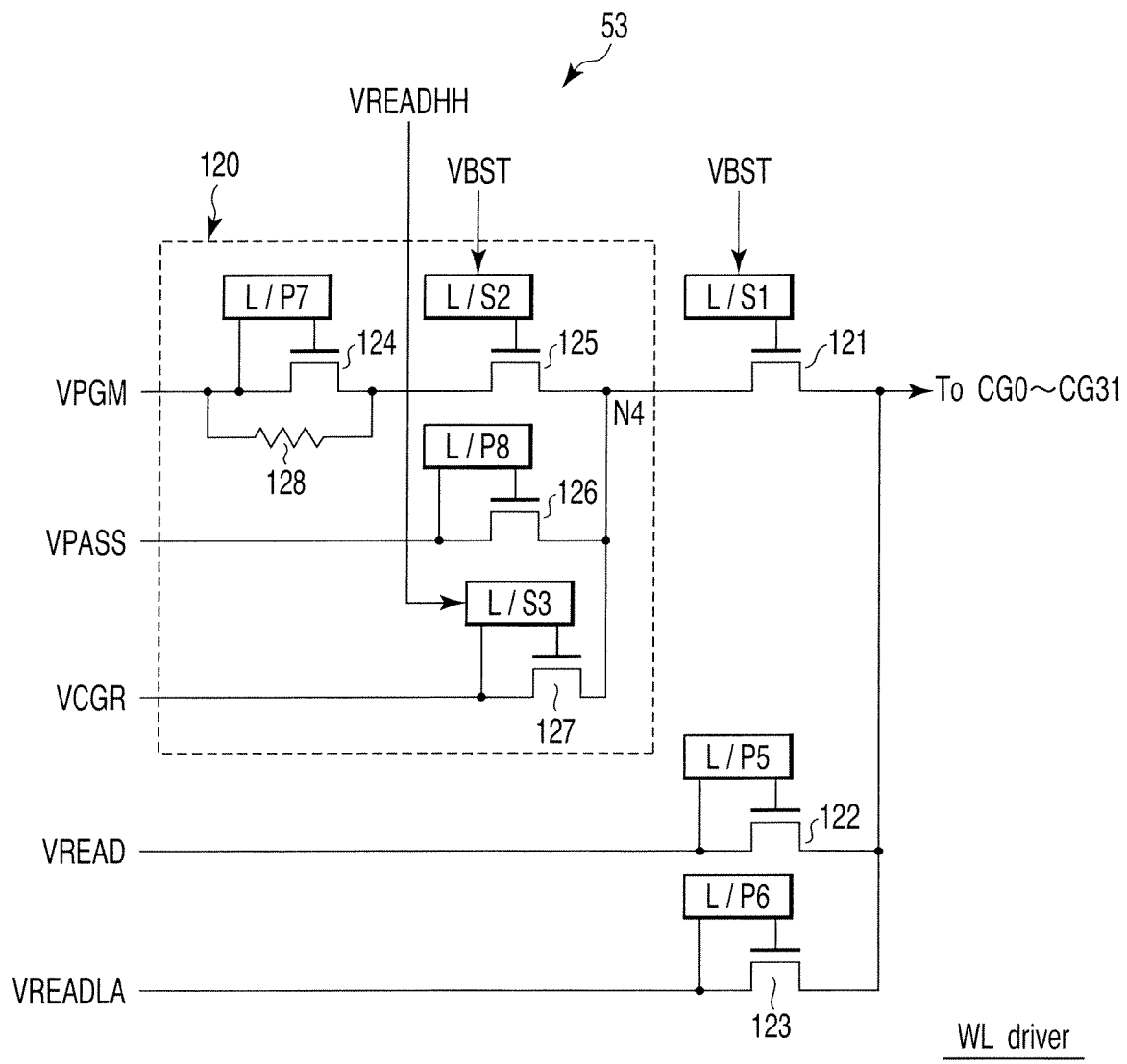
F I G. 9

| WL \ OP | Program | Read |
|---|---|---|
| WLi (Selected) | VPGM | VCGR |
| WL(i+1) (Unselected) | VPASS | VREADLA |
| WL0–WL(i–1), WL(i+2)–WL31 (Unselected) | VPASS | VREAD |

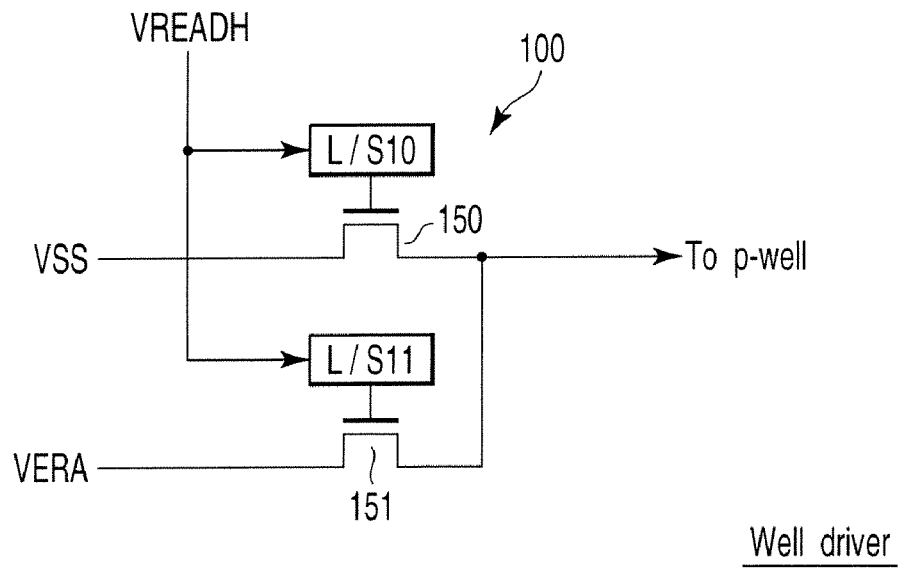
F I G. 14
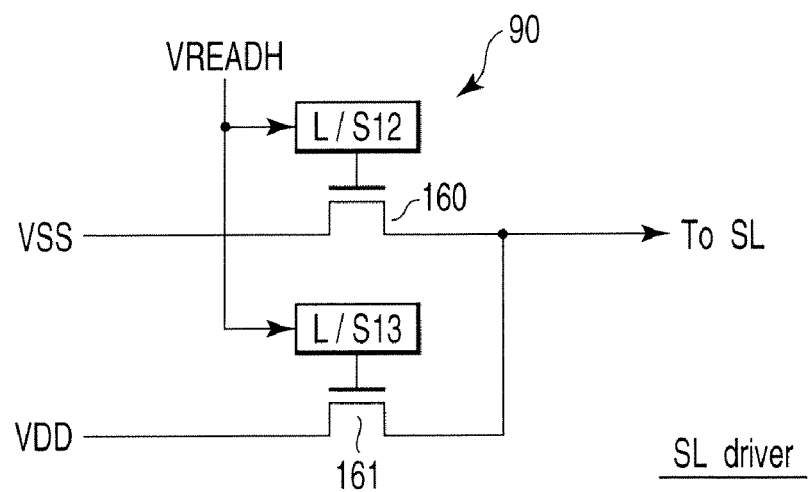
F I G. 15

| | Voltage |
|---|---|
| SGD | VSGD |
| WL(i+1)–WL31 | VPASS |
| WLi | VPGM |
| WL0–WL(i-1) | VPASS |
| SGS | 0V |

Selected → WLi

Program(VPGM>VPASS)

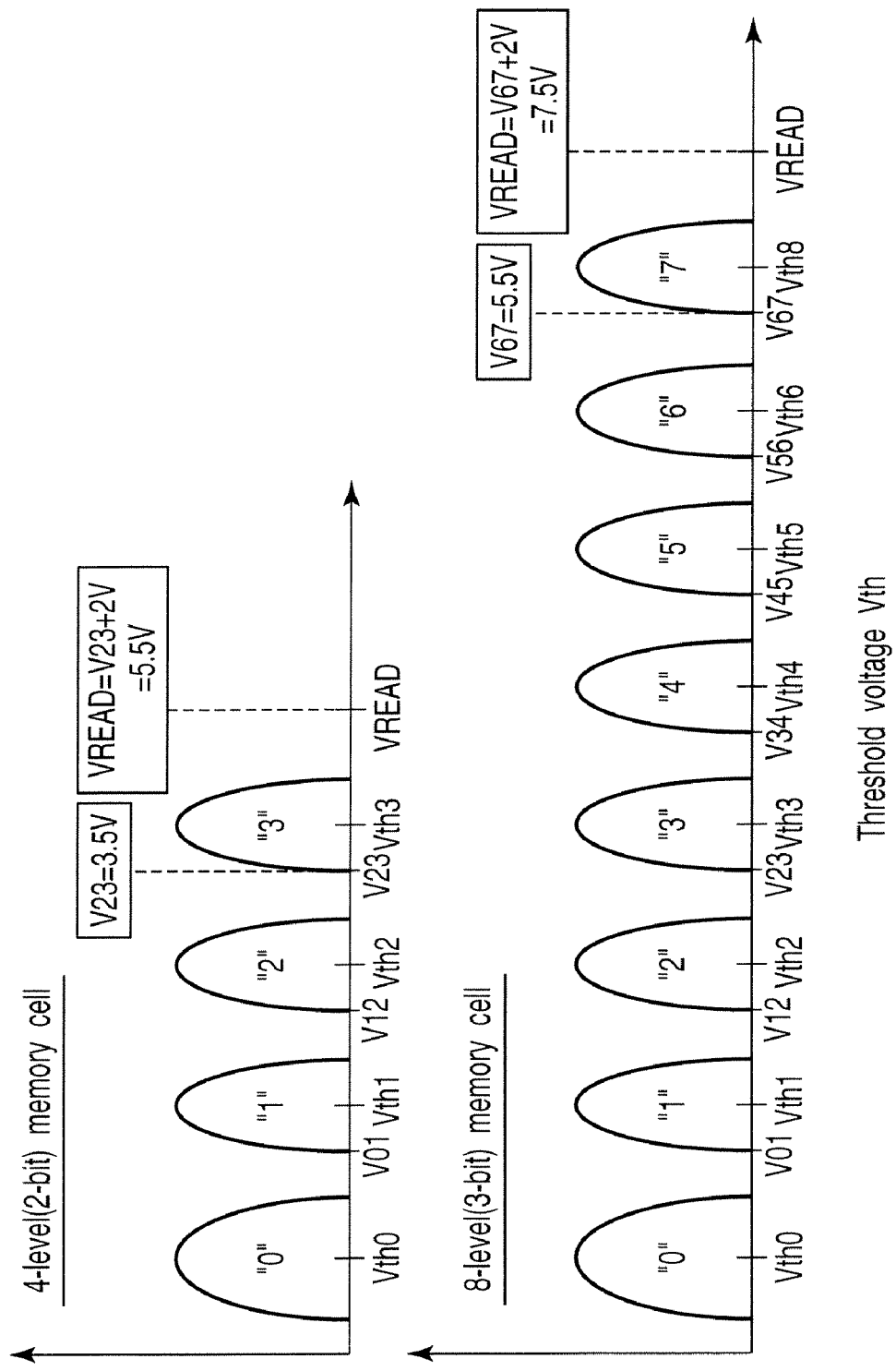
F I G. 20

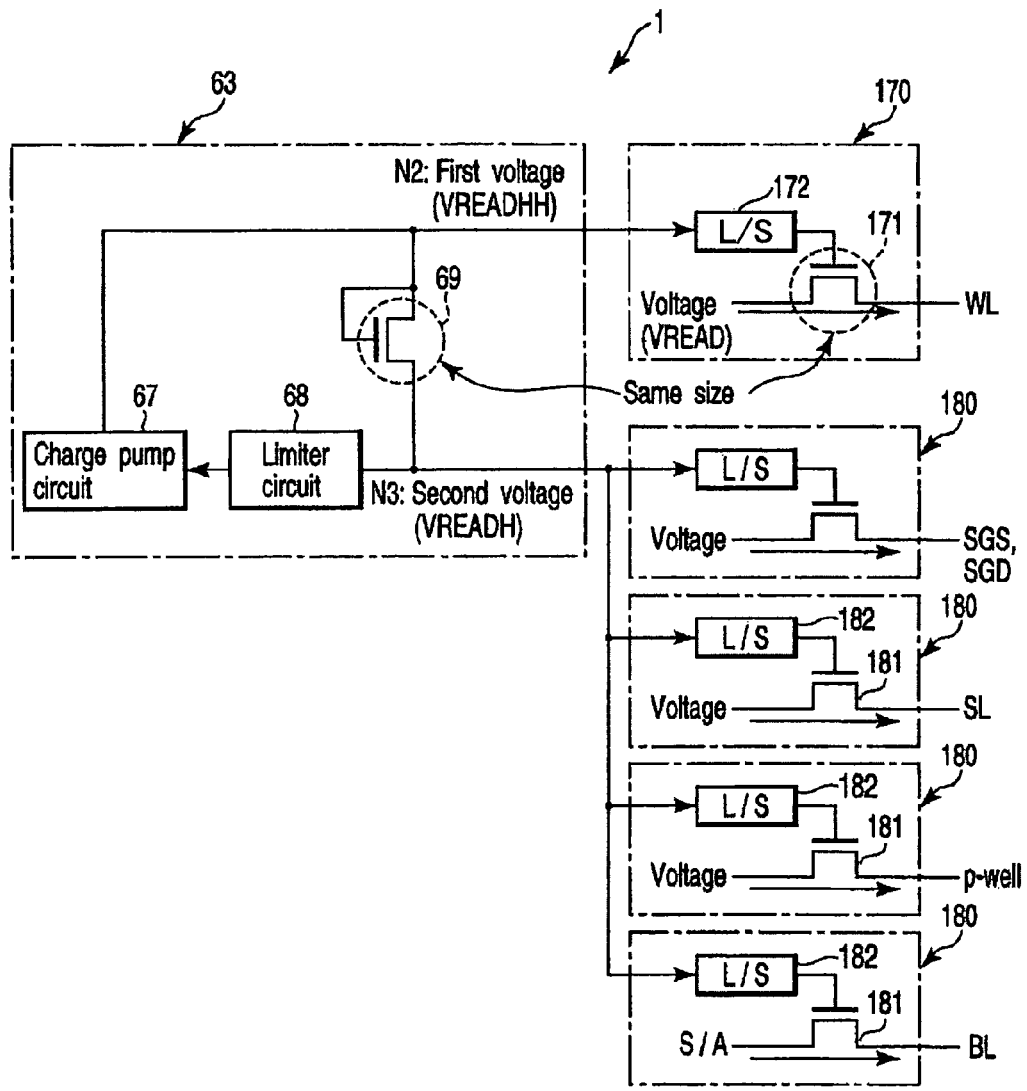
F I G. 21

US 7,898,851 B2

SEMICONDUCTOR MEMORY DEVICE WHICH INCLUDES MEMORY CELL HAVING CHARGE ACCUMULATION LAYER AND CONTROL GATE

BACKGROUND OF THE INVENTION

1. Field of the Invention

The present invention relates to a semiconductor memory device. For example, the present invention relates to a semiconductor memory device including memory cells each having a charge accumulation layer and a control gate.

2. Description of the Related Art

Electrically erasable and programmable read-only memories (EEPROMs) are known as nonvolatile semiconductor memories that allow data to be electrically rewritten. For data reading in an EEPROM, a row decoder selects one of word lines and transfers a voltage to the selected word line. For example, Jpn. Pat. Appln. KOKAI Publication Nos. 2006-114139 and 2003-086720 have proposed row decoder configurations.

NAND flash memories are known as EEPROMs that allow an increase in capacity and in integration degree. For data reading in a NAND flash memory, a voltage that enables memory cells to be turned on is transferred to unselected word lines regardless of data held in the memory cells.

Then, if a high voltage needs to be applied to the unselected word lines, an increased load is imposed on a voltage generator that generates this voltage. Furthermore, the voltage generator tends to have a large circuit area.

BRIEF SUMMARY OF THE INVENTION

A semiconductor memory device according to an aspect of the present invention includes:

a memory cell unit including a plurality of memory cells connected in series and each having a charge accumulation layer and a control gate formed on the charge accumulation layer;

word lines connected to the control gates of the memory cells;

a driver circuit which, for data reading, selects one of the word lines and transfers voltage to the selected word line and unselected word line; and a voltage generator which generates a first voltage and a second voltage which is lower than the first voltage, the first voltage being used by the driver circuit to transfer the voltage to the unselected word line, the second voltage being used by circuits other than the driver circuit.

BRIEF DESCRIPTION OF THE SEVERAL VIEWS OF THE DRAWING

FIG. 1 is a block diagram of a flash memory according to an embodiment of the present invention;

FIG. 4 is a block diagram of a first voltage generator, a second voltage generator, and a fourth voltage generator according to the embodiment of the present invention;

FIG. 5 is a block diagram of a third voltage generator according to the embodiment of the present invention;

FIG. 6 is a diagram showing voltages generated by the first to fourth voltage generators according to the embodiment of the present invention;

FIG. 9 is a circuit diagram of a word line decoder according to the embodiment of the present invention;

FIG. 14 is a circuit diagram of a well driver according to the embodiment of the present invention;

FIG. 15 is a circuit diagram of a source line driver according to the embodiment of the present invention;

FIG. 20 is a graph showing the threshold distribution of a memory cell transistor;

FIG. 21 is a block diagram of the flash memory according to the embodiment of the present invention.

DETAILED DESCRIPTION OF THE INVENTION

Figure 2:
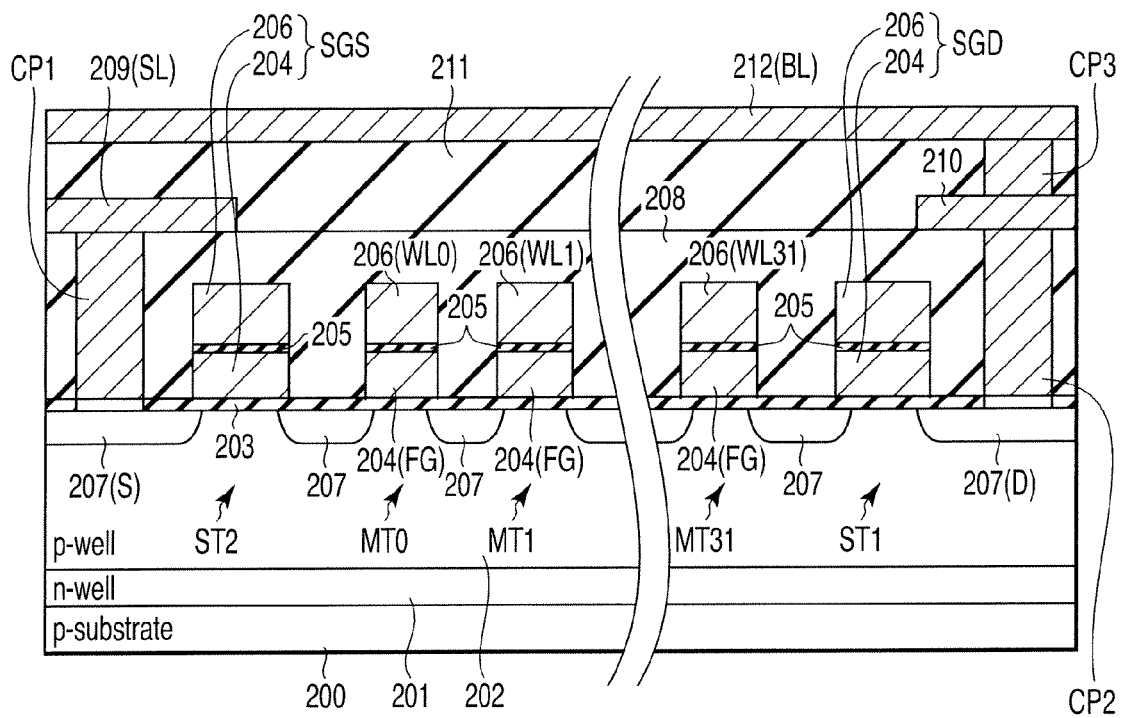
FIG. 2 is a sectional view of the flash memory according to the embodiment of the present invention.

An embodiment of the present invention will be described. FIG. 1 is a block diagram of a NAND flash memory according to the present embodiment.

As shown in figure, a NAND flash memory 1 includes a memory cell array 10, a column selector 20, a sense amplifier 30, a row decoder 40, a driver circuit 50, a voltage generator group 60, a control circuit 70, a voltage driver 80, a source line driver 90, and a well driver 100.

First, the memory cell array 10 will be described. The memory cell array 10 includes a plurality of memory cell units 11. Each of the memory cell units 11 includes, for example, 32 memory cell transistors MT and select transistors ST1 and ST2. Each of the memory cell transistors includes a charge accumulation layer (for example, a floating gate) formed on a semiconductor substrate with a gate insulating film interposed therebetween and a control gate electrode formed on the charge accumulation layer with an intergate insulating film interposed therebetween. The number of the memory cell transistors MT is not limited to 32, and may be 8, 16, 64, 128, 256, or the like; no limitation is imposed on the number of memory cell transistors MT. The adjacent memory cell transistors MT share a source and a drain. The memory cell transistors MT are arranged between the select transistors ST1 and ST2 so that current paths of the memory cell transistors MT are connected in series. A drain at one end side of the memory cell transistors MT connected in series is connected to a source of the select transistor ST1. A source at the other end side is connected to a drain of the select transistor ST2.

The control gate electrodes of the memory cell transistors MT in the same row are commonly connected to one of word lines WL0 to WL31. Gates of the select transistors ST1 and ST2 in the same row for the memory cells are commonly connected to a select gate line SGD and SGS, respectively. For simplification of description, the word lines WL0 to WL31 may hereinafter be simply collectively referred to as a word line WL. Drains of the select transistors ST1 in the same column in the memory cell array 10 are commonly connected one of bit lines BL to BLm (m is a natural number). The bit lines BL0 to BLm may also hereinafter be simply collectively referred to as a bit line BL. Sources of the select transistors ST2 are commonly connected to a source line SL. It is not always needed for both select transistors ST1 and ST2 to be provided, and if the memory cell unit 11 can be selected, only either of them may be provided for this semiconductor memory device.

FIG. 1 shows only one row of the memory cell units 11. However, plural rows of the memory cell units 11 may be provided in the memory cell array 10. In this case, the memory cell units 11 in the same column are connected to the same bit line BL. Data is written, at a time, to the plurality of memory cell transistors MT connected to the same word line WL. This unit is called a page. Moreover, data is erased from the plurality of memory cell units 11 in the same row at a time. This unit is called a memory block.

For data writing and reading, the column selector 20 selects any of the bit lines BL and connects the selected bit line BL to the sense amplifier 30. The circuit configuration of the column selector 20 will be described below.

For reading, the sense amplifier 30 (labeled "S/A" in FIG. 1) senses data read from any of the memory cell transistors MT to the corresponding bit line BL and amplifies the sensed data. For writing, the sense amplifier 30 transfers a voltage to any of the bit lines BL.

The source line driver 90 provides a voltage to the source line SL. The circuit configuration of the source driver 90 will be described below.

The well driver 100 applies a voltage to a well region in which the memory cell array is formed. That is, the well driver 100 provides a back gate bias for the memory cell transistors MT. The circuit configuration of the well driver 100 will be described below.

The row decoder 40 includes MOS transistors 41 and 42 provided for the select gate lines SGD and SGS, respectively, MOS transistors 43 each provided for a corresponding one of the word lines WL0 to WL31, and a block decoder 44.

One end of a current path of each of the MOS transistors 41, 42 is connected to the corresponding select gate lines SGD, SGS, respectively. The other end of the current path of each of the MOS transistors 41, 42 is connected to signal lines SGDD, SGSD, respectively. One end of a current path of each of the MOS transistors 43 is connected to a corresponding one of the word lines WL0 to WL31. The other end of the current path of the MOS transistor 43 is connected to a corresponding one of signal lines CG0 to CG31. If the signal lines CG0 to CG31 need not be distinguished from one another, the signal lines CG0 to CG31 are simply collectively referred to as a signal line CG. Gates of the MOS transistors 41 to 43 are connected to the same control line TG; the MOS transistors 41 to 43 are connected to the select gate lines SGD and SGS and the word lines WL, connected to the select transistors ST1 and ST2 and the memory cell transistors MT, respectively, in the same memory block.

The block decoder 44 receives and decodes external block addresses. The block decoder 44 selects the control line TG to which the MOS transistors 43 corresponding to the memory cell unit 11 including a selected memory cell transistor is connected, to turn on the MOS transistors 41 to 43. The circuit configuration of the block decoder 44 will be described below.

The driver circuit 50 includes select gate line drivers 51 and 52 provided for the signal lines SGDD and SGSD, respectively, and word line drivers 53 each provided for a corresponding one of the signal lines CG.

The select gate line drivers 51 and 52 apply voltages to the signal lines SGDD and SGSD, respectively, in accordance with the result of decoding of an externally provided page address. Each of the word line drivers 53 applies a voltage to a corresponding one of the signal lines CG0 to CG31 in accordance with the result of decoding of the page address. Description of the configuration of each of the drivers 51 to 53 and voltages applied by the drivers 51 to 53 will be given later.

The control circuit 70 receives an external command to control the operation of the voltage generator group 60 in accordance with the command. That is, the control circuit 70 gives commands to the voltage generator group 60 so that the voltage generator group 60 generates appropriate voltages for data programming, reading, erasure, and the like.

The voltage generator group 60 includes a first voltage generator to a fourth voltage generator 61 to 64. Each of the first to fourth voltage generators 61 to 64 generates a voltage in accordance with a command from the control circuit 70 to supply the generated voltage to the driver circuit 50, the well driver 100, and the voltage driver 80. Description will be given of the configuration of the first to fourth voltage generators 61 to 64 and voltages generated by the voltage generators 61 to 64.

The voltage driver 80 generates a predetermined voltage on the basis of the voltage generated by the voltage generator group 60 and supplies the predetermined voltage to the driver circuit 50 and the block decoder 44. The details of the voltage driver 80 will also be described below.

<Details of the Memory Cell Array 10>

The configuration of the NAND cell 11, provided in the memory cell array 10, will be described below with reference to FIG. 2. FIG. 2 is a sectional view taken along a bit line direction of the NAND cell 11.

As shown in FIG. 2, an n-type well region 201 is formed in a surface area of a p-type semiconductor substrate 200. A p-type well region 202 is formed in a surface area of the n-type well region 201. A gate insulating film 203 is formed on the p-type well region 202. Gate electrodes of the memory cell transistors MT and the select transistors ST1 and ST2 are formed on the gate insulating film 203. The gate electrodes of the memory cell transistors MT and the select transistors ST1 and ST2 each have a polycrystalline silicon layer 204 formed on the gate insulating film 203, an inter-gate insulating film 205 formed on the polycrystalline silicon layer 204, and a polycrystalline silicon layer 206 formed on the inter-gate insulating film 205. The inter-gate insulating film 205 is formed of, for example, a silicon oxide film, an ON, NO, or ONO film each of which is a stack structure of a silicon oxide film and a silicon nitride film, a stack structure containing any of the ON, NO, and ONO films, or a stack structure containing a $TiO_2$, $HfO_2$, $Al_2O_3$, $HfAlO_x$, or HfAlSi film and a silicon oxide film or a silicon nitride film. The gate insulating film 203 functions as a tunnel insulating film.

In the memory cell transistor MT, the polycrystalline silicon layer 204 functions as a floating gate (FG). On the other hand, the polycrystalline silicon layers 206 arranged adjacent to each other in a direction orthogonal to the bit lines are connected together and function as control gate electrodes (word lines WL). In the select transistors ST1 and ST2, the polycrystalline silicon layers 204 and 206 arranged adjacent to each other in the direction of the word lines are connected together. The polycrystalline silicon layers 204 and 206 function as the select gate lines SGS and SGD. Alternatively, the polycrystalline silicon layer 204 alone may function as the select gate line. In this case, the potential of the polycrystalline silicon layer 206 in each of the select transistors ST1 and ST2 is fixed or floating. $N^+$-impurity diffusion layers 207 are each formed in a part of the surface of the semiconductor substrate 200 which is located between the gate electrodes. Each of the impurity diffusion layers 207 is shared by the adjacent transistors and functions as a source (S) or a drain (D). The area between the source and drain arranged adjacent to each other functions as a channel region in which electron moves. The gate electrode, the impurity diffusion layers 207, and the channel region form MOS transistor functioning as the memory cell transistors MT and the select transistors ST1 and ST2.

An interlayer insulating film 208 is formed on the semiconductor substrate 200 so as to cover the memory cell transistors MT and the select transistors ST1 and ST2. A contact plug CP1 is formed in the interlayer insulating film 208 so as to extend to the impurity diffusion layer (source) 207 in the source-side select transistor ST2. A metal wiring layer 209 connected to the contact plug CP1 is formed on the interlayer insulating film 208. The metal wiring layer 209 functions as a part of the source line SL. A contact plug CP2 is formed in the interlayer insulating film 208 so as to extend to the impurity diffusion layer (drain) 207 in the drain-side select transistor ST1. A metal wiring layer 210 connected to the contact plug CP2 is formed on the interlayer insulating film 208.

An interlayer insulating film 211 is formed on the interlayer insulating film 208 so as to cover the metal wiring layers 209 and 210. A contact plug CP3 is formed in the interlayer insulating film 211 so as to extend to the metal wiring layer 210. A metal wiring layer 212 connected to a plurality of the contact plugs CP3 is formed on the interlayer insulating film 211. The metal wiring layer 212 functions as a bit line BL.

Figure 3:
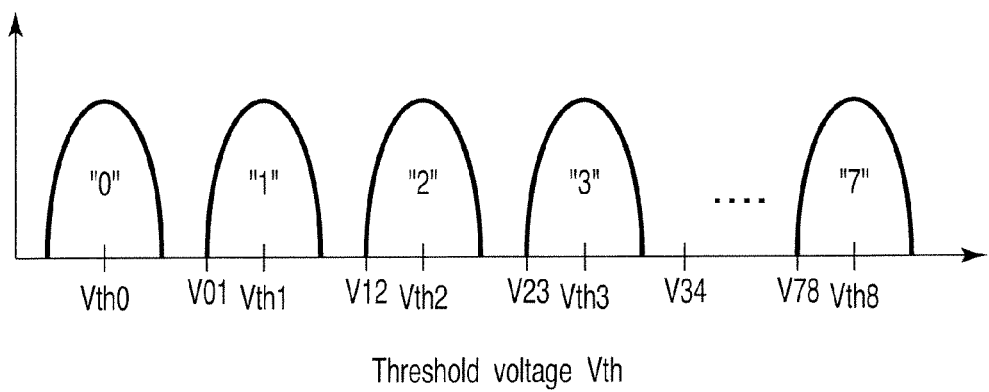
FIG. 3 is a graph showing the threshold distribution of a memory cell transistor according to the embodiment of the present invention.

Now, the threshold distribution of the memory cell transistor MT will be described with reference to FIG. 3. In FIG. 3, the axis of abscissa indicates a threshold voltage Vth, and the axis of ordinate indicates the presence probability of the memory cell transistor MT.

As shown in FIG. 3, each of the memory cell transistors MT can hold 8 levels of data (3-bit data). That is, the memory cell transistor MT can hold eight types of data, "0", "1", "2", "3", . . . , "7", corresponding to the order of increasing threshold voltage Vth. For a threshold voltage Vth0 for "0" data in the memory cell transistor MT, Vth0<V01. For a threshold voltage Vth1 for "1" data, $V01 \leq Vth1 < V12$. For a threshold voltage Vth2 for "2" data, $V12 \leq Vth2 < V23$. For a threshold voltage Vth3 for "3" data, $V23 \leq Vth3 < V34$. For a threshold voltage Vth4 for "4" data, $V34 \leq Vth4 < V45$. For a threshold voltage Vth5 for "5" data, $V45 \leq Vth5 < V56$. For a threshold voltage Vth6 for "6" data, $V56 \leq Vth6 < V67$. For a threshold voltage Vth7 for "7" data, $V67 \leq Vth7$.

The data that can be held by the memory cell data is not limited to 8 levels, but for example, 2 levels (1 bit data), 4 levels (2 bit data), or 16 levels (4 bit data) may be used.

Now, the details of the first to fourth voltage generators 61 to 64 will be described. First, the first, second, and fourth voltage generators 61, 62, and 64 will be described with reference to FIG. 4. FIG. 4 is a block diagram of the first, second, and fourth voltage generators 61, 62, and 64.

As shown in FIG. 4, each of the voltage generators 61, 62, and 64 includes a charge pump circuit 65 and a limiter circuit 66. To program or read the data in the memory cell transistor MT, the charge pump circuit 65 generates a voltage to be applied to the unselected word line WL located adjacent to the selected word line WL. The limiter circuit 66 monitors the potential of a node N1 to which a voltage generated by the charge pump circuit 65 is output. The limiter circuit 66 controls the operation of the charge pump circuit 65 in accordance with the potential of the node N1. More specifically, when the potential of the node N1 decreases below a desired potential, the limiter circuit 66 commands the charge pump circuit 65 to raise the voltage to be generated.

Now, the third voltage generator 63 will be described with reference to FIG. 5. FIG. 5 is a block diagram of the third voltage generator 63.

As shown in the figure, the third voltage generator 63 includes a charge pump circuit 67, a limiter circuit 68, and an n-channel MOS transistor 69. To program or read the data in the memory cell transistor MT, the charge pump circuit 65 generates a voltage to be used any of the row decoder 40, the driver circuit 50, the source line driver 90, and the well driver 100. The voltage is not applied directly to the word line WL but is used by a peripheral circuit for the memory cell array 10. The charge pump circuit 65 outputs the generated voltage to a node N2.

One end of a current path of the MOS transistor 69 and a gate of the MOS transistor 69 are connected to the node 2. The other end of the current path of the MOS transistor 69 is connected to a node N3. That is, the MOS transistor 69 behaves as a diode having a current path with the one end functioning as an anode and the other end functioning as a cathode. The MOS transistor 69 has the same size (the same gate length and/or gate width) as that of a MOS transistor transferring a voltage VREAD described below. That is, the MOS transistor 69 has the same threshold voltage as that of the MOS transistor transferring the voltage VREAD.

The limiter circuit 68 monitors the potential of the node N3. The limiter circuit 68 thus controls the operation of the charge pump circuit 67 in accordance with the potential of the node N3. More specifically, when the potential of the node N3 decreases below the desired potential, the limiter circuit 68 commands the charge pump circuit 67 to raise the voltage to be generated.

The third voltage generator 63 configured as described above outputs, through the node N2, the voltage VREADHH (for example, 8V+Vth; Vth is the threshold voltage of the MOS transistor 69), generated by the charge pump circuit 67. The third voltage generator 63 outputs a voltage VREADH (for example, 8 V) lower than the voltage VREADHH, through the node N3.

The voltages output by the first to fourth voltage generators 61 to 64 will be described with reference to FIG. 6. FIG. 6 is a diagram showing the voltages output by the first to fourth voltage generators 61 to 64 for programming and for reading.

As shown in FIG. 6, the first voltage generator 61 generates a voltage VPASS for programming and a voltage VREADLA for reading. The second voltage generator 62 generates the voltage VPASS for programming and the voltage VREAD for reading. The third voltage generator 63 generates the voltages VREADHH and VREADH both for programming and for reading. The fourth voltage generator 64 generates a voltage VPGM for programming and a voltage VCGR for reading. Applications of these voltages will be described below.

The voltage generator group 60 includes voltage generators generating other voltages as required. However, these voltage generators will not be described below.

<Details of the Voltage Driver 80>

Figure 7:
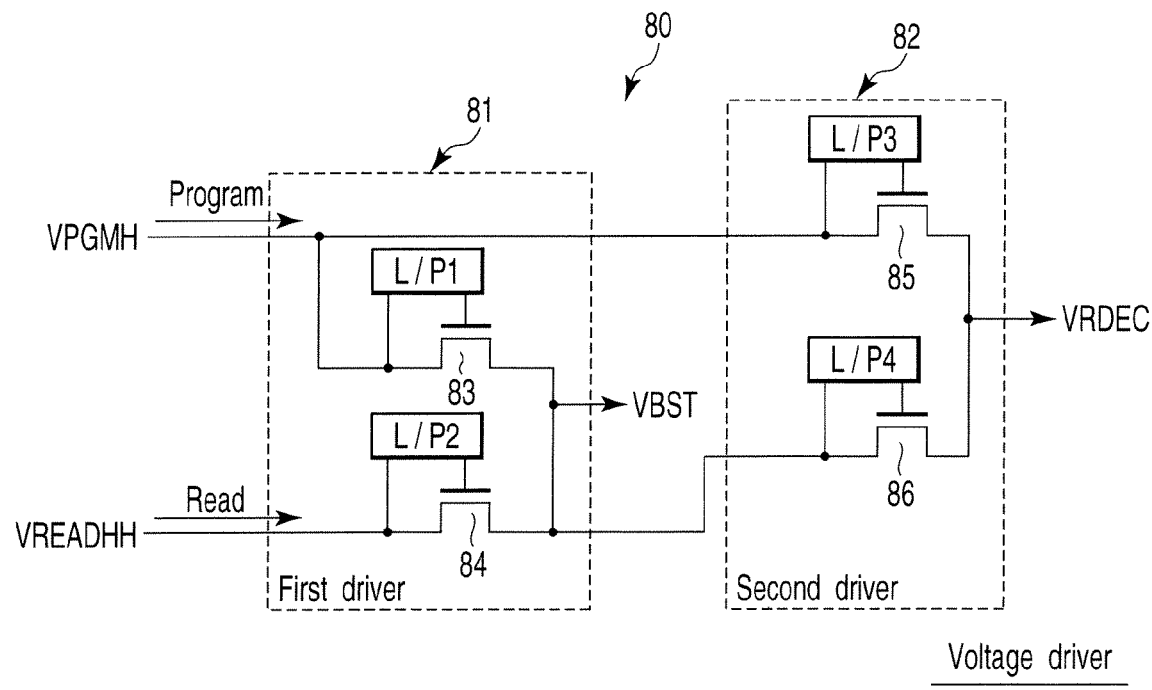
FIG. 7 is a circuit diagram of a voltage driver according to the embodiment of the present invention.

Now, the configuration of the voltage driver 80 will be described with reference to FIG. 7. FIG. 7 is a circuit diagram of the voltage driver 80.

As shown in FIG. 7, the voltage driver 80 includes a first decoder 81 and a second decoder 82. The first decoder 81 includes n-channel MOS transistors 83 and 84 and local pump circuits L/P1 and L/P2.

For programming, a voltage VPGMH is applied to one end of a current path of the MOS transistor 83; the one end is connected to the local pump circuit L/P1. For example, the voltage VPGMH is generated by a voltage generator (not shown) included in the voltage generator group 60 and is higher than the voltage VPGM. For programming, the local pump circuit L/P1 applies a voltage to a gate of the MOS transistor 83.

For reading, the voltage VREADHH is applied to one end of a current path of the MOS transistor 84; the one end is connected to the local pump circuit L/P2. For example, the voltage VREADHH is higher than each of the voltages VCGR and VREAD. For programming, the local pump circuit L/P2 applies a voltage to a gate of the MOS transistor 84. Other ends of the current paths of the MOS transistors 83 and 84 are connected together. The voltage of the common connection node between the other ends is output to an external device as a voltage VBST.

With the above-described configuration, in the first decoder 81, the MOS transistor 83 is turned on to output the voltage VBST=VPGMH for programming. For reading, the MOS transistor 84 is turned on to output the voltage VBST=VREADHH.

Now, the second decoder 82 will be described. The second decoder 82 includes n-channel MOS transistors 85 and 86 and local pump circuits L/P3 and L/P4.

For programming, the voltage VPGMH is applied to one end of a current path of the MOS transistor 85; the one end is connected to the local pump circuit L/P3. For programming, the local pump circuit L/P3 applies a voltage to a gate of the MOS transistor 85.

For reading, the voltage VREADHH is applied to one end of a current path of the MOS transistor 86; the one end is connected to the local pump circuit L/P4. For programming, the local pump circuit L/P4 applies a voltage to a gate of the MOS transistor 86. Other ends of the current paths of the MOS transistors 85 and 86 are connected together. The voltage of the common connection node between the other ends is output to an external device as a voltage VRDEC.

With the above-described configuration, in the second decoder 82, the MOS transistor 85 is turned on to output the voltage VRDEC=VPGMH for programming. For reading, the MOS transistor 86 is turned on to output the voltage VBST=VREADHH.

<Details of the Block Decoder 44>

Figure 8:
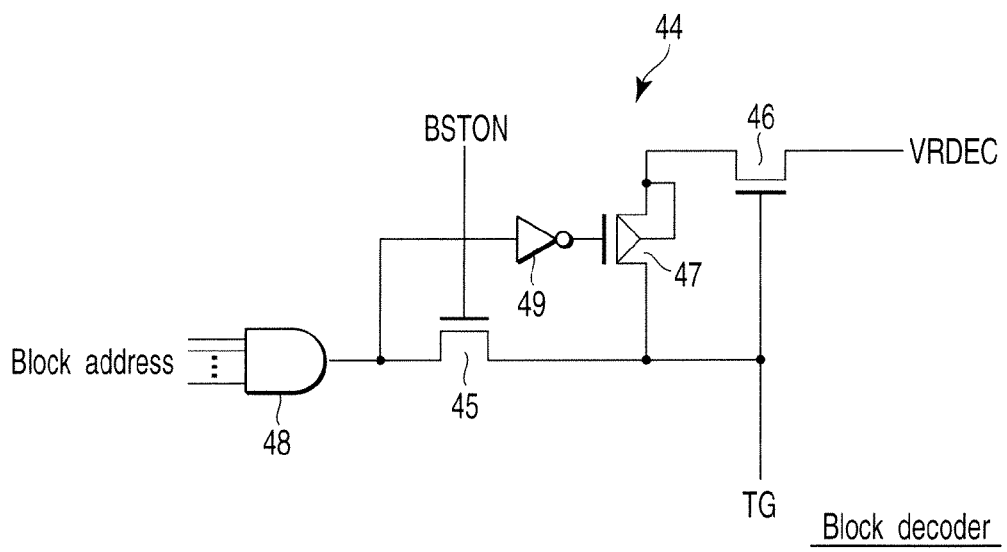
FIG. 8 is a circuit diagram of a block decoder according to the embodiment of the present invention.

The configuration of the block decoder 44 will be described with reference to FIG. 8. FIG. 8 is a circuit diagram of the block decoder 44.

As shown in FIG. 8, the block decoder 44 includes n-channel MOS transistors 45 and 46, a p-channel MOS transistor 47, an AND gate 48, and an inverter 49.

The AND gate 48 performs an AND operation on the bits of an externally provided block address. Thus, when the block address indicates a memory block corresponding to the block decoder, the AND gate 48 outputs an "H" level. The MOS transistor 45 has a current path with one end connected to an output node of the AND gate 48 and other end connected to the control line TG. A signal BSTON is provided to a gate of the MOS transistor 45. The signal BSTON is input to allow the block decoder 44 to load address information. The inverter 49 inverts the result of the operation by the AND gate 48. The MOS transistor 47 has a current path with one end connected to the control line TG and other end connected to a back gate. The result of the inversion by the inverter 49 is input to a gate of the MOS transistor 47. A current path of the MOS transistor 46 has one end to which the voltage VRDEC is provided and other end connected to the other end of the current path of the MOS transistor 47. A gate of the MOS transistor 46 is connected to the control line TG.

In the block decoder 44 configured as described above, when the block address matches the memory block, the MOS transistors 46 and 47 are turned on to apply the voltage VRDEC to the control line TG. That is, for programming, VRDEC=VPGMH is applied to the control line TG. For reading, VRDEC=VREADHH is applied to the control line TG. As a result, the MOS transistors 41 to 43 are turned on.

<Details of the Word Line Driver 53>

Now, the configuration of the word line driver 53, described with reference to FIG. 1, will be described with reference to FIG. 9. FIG. 9 is a circuit diagram of each word line driver 53. As shown in the figure, the word line driver 53 includes a voltage selector 120, n-channel MOS transistors 121 to 123, local pump circuits L/P5 and L/P6, and a level shifter L/S1.

The voltage selector 120 includes n-channel MOS transistors 124 to 127, a resistance element 128, local pump circuits L/P7 and L/P8, and level shifters L/S2 and L/S3.

The voltage VPGM is applied to one end of the MOS transistor 124 which is connected to the local pump circuit L/P7. The local pump L/P7 applies a voltage to a gate of the MOS transistor 124.

The MOS transistor 125 has a current path with one end connected to other end of a current path of the MOS transistor 124. An output from the level shifter L/S2 is provided to a gate of the MOS transistor 125. For programming, the level shifter L/S2 receives the voltage VBST from the voltage selector 80 and shifts the level of the voltage VBST for output.

The MOS transistor 126 has a current path with one end to which a voltage VPASS is provided, and is connected to the local pump circuit L/P8, and a gate to which an output from the local pump circuit L/P8 is provided.

The MOS transistor 127 has a current path with one end to which the voltage VCGR is provided. An output from the level shifter L/S3 is provided to a gate of the MOS transistor 127. For reading, the level shifter L/S3 receives the VREADHH from the third voltage generator 63 and shifts the level of the voltage VREADHH for output.

One end of the resistance element 128 is connected to the one end of the current path of the MOS transistor 124. Other end of the resistance element 128 is connected to the other end of the current path of the MOS transistor 124.

One ends of the current paths of the MOS transistors 125 to 127 are connected together. A common connection node N4 between the MOS transistors 125 to 127 functions as an output node of the voltage selector 120.

The MOS transistor 121 has a current path with one end connected to the node N4 and other end connected to one of the signal lines CG0 to CG31. An output from the level shifter L/S1 is provided to a gate of the MOS transistor 121. For programming or reading, the level shifter L/S1 receives the VBST from the voltage selector 80 and shifts the level of the voltage VBST for output.

The MOS transistor 122 has a current path with one end to which the voltage VREAD is provided and which is connected to the local pump circuit L/P5 and other end connected to one of the signal lines CG0 to CG31. An output from the local pump circuit L/P5 is provided to a gate of the MOS transistor 122.

The MOS transistor 123 has a current path with one end to which the voltage VREADLA is provided and which is connected to the local pump circuit L/P6 and other end connected to one of the signal lines CG0 to CG31. An output from the local pump circuit L/P6 is provided to a gate of the MOS transistor 123.

With the above-described configuration, in the word line driver 53 corresponding to the selected word line, the MOS transistors 121 and 125 are turned on to transfer the voltage VPGM to the corresponding signal line CG for programming. For reading, the MOS transistors 121 and 127 are turned on to transfer the voltage VCGR to the corresponding signal line CG. The voltages VPGM and VCGR are transferred to the selected word line via the current paths of the MOS transistors 43 in the row decoder 40.

In the word line driver 53 corresponding to the unselected word line, for programming, the MOS transistors 121 and 126 are turned on to transfer the voltage VPASS to the corresponding signal line CG. For reading, the MOS transistor 122 or 123 is turned on to transfer the voltage VREAD or VREADLA to the corresponding signal line CG. The voltage VPASS and the voltage VREAD or VREADLA are transferred to the unselected word line via the current paths of the MOS transistors 43 in the row decoder 40.

Figure 10:
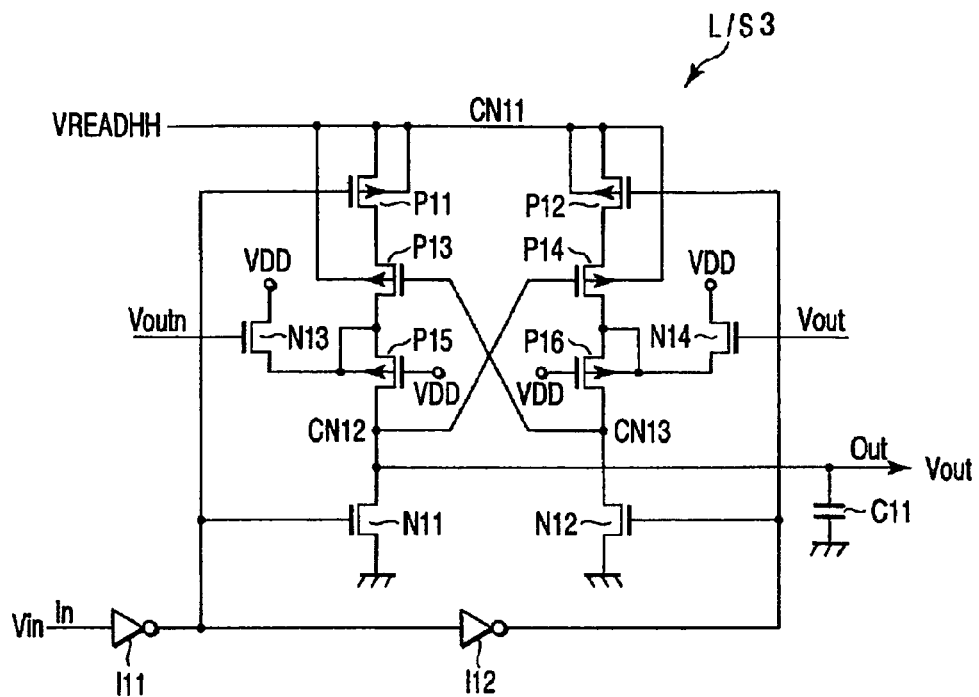
FIG. 10 is a circuit diagram of a level shifter according to the embodiment of the present invention.

The configuration of the level shifters L/S1 to L/S3 will be described with reference to FIG. 10. FIG. 10 is a circuit diagram of the level shifter L/S3. As shown in FIG. 10, the level shifter L/S3 includes p-channel MOS transistors P11 to P16, n-channel transistors N11 to N14, a capacitance element C11, and inverters 111 and 112.

Sources and back gates (wells or substrates) of the MOS transistors P11 and P12 are connected to a connection node CN11. The voltage VREADHH is supplied to the node CN11 as a power supply voltage. Drains of the MOS transistors P11 and P12 are connected to sources of the MOS transistors P13 and P14, respectively. Back gates of the MOS transistors P13 and P14 are connected to the connection node CN11. Drains of the MOS transistors P13 and P14 are connected to sources and back gates of the MOS transistors P15 and P16, respectively. A fixed voltage, for example, VDD, is supplied to gates of the MOS transistors P15 and P16. Drains of the MOS transistors P15 and P16 are cross-connected to the gates of the MOS transistors P16 and P15, respectively. The drains of the MOS transistors P15 and P16 are grounded via the MOS transistors N11 and N12. Thus, the MOS transistor P15 is connectively interposed between the drain of the MOS transistor P13 and a connection node CN12 between the gate of the MOS transistor P14 and the MOS transistor N11. The MOS transistor P16 is connectively interposed between the drain of the MOS transistor P14 and a connection node CN13 between the gate of the MOS transistor P13 and the MOS transistor N12.

An input signal Vin is supplied to an input end IN. The input signal Vin is supplied to gates of the MOS transistors N11 and P11 via an inverter circuit 111. An output signal from the inverter circuit 111 is supplied to gates of the MOS transistors N12 and P12 via an inverter circuit 112. The connection node between the MOS transistor N11 and the MOS transistor P15 corresponds to an output end OUT of the level shift circuit. A capacitor C11 as an output load is connected between the output end OUT and the ground.

Drains of the N13 and N14 are connected to the back gates of the MOS transistors P15 and P16. A fixed voltage, for example, VDD, is supplied to sources of the MOS transistors N13 and N14. An output signal Vout is supplied to a gate of the MOS transistor N14. An inverted output signal Voutn from the node CN13 is supplied to the gate of the MOS transistor N13.

With the above-described configuration, if the input signal Vin is at a low level, an output signal from the inverter circuit I11 is at a high level, and an output signal from the inverter circuit 112 is at a low level. This turns off the MOS transistor P11, turns on the MOS transistor P12, turns off the MOS transistor P13, turns on the MOS transistors P14 and N11, and turns off the MOS transistor N12. Thus, the output signal Vout from the output end OUT is at the low level.

At this time, the voltage VDD is supplied to the gate of the MOS transistor P15. However, since the MOS transistor P13 is off, the MOS transistor P15 is off. Furthermore, since the output signal Vout is at the low level, the MOS transistor N13, to which the inverted output signal Voutn is supplied, is turned on. The voltage VDD is thus supplied to the back gate of the MOS transistor P15.

Furthermore, the output signal Vout of the low level is supplied to the gate of the MOS transistor N14, which is thus off. The voltage VREADHH from the turned-on MOS transistor P14 is supplied to a source of the MOS transistor P16 to the gate of which the voltage VDD is supplied. Thus, the MOS transistor P16 turns on. The connection node between the MOS transistors P16 and N12 has the voltage VREADHH. Thus, the MOS transistor P13 to the gate of which the voltage VREADHH is supplied is kept off.

On the other hand, setting the input signal Vin to the high level turns on the MOS transistor P11, turns off the MOS transistor P12, turns on the MOS transistor P13, turns off the MOS transistor P14, turns on the MOS transistor P15, turns off the MOS transistors P16 and N11, turns on the MOS transistor N12, turns off the MOS transistor N13, and turns on the MOS transistor N14. The output signal Vout of the high level (the voltage VREADHH) is output from the output end OUT. Consequently, the voltage VDD is supplied to the back gate of the turned-off MOS transistor P16 via the MOS transistor N14. The connection node between the MOS transistor P15 and the MOS transistor N11 has the voltage VREADHH. Thus, the MOS transistor P14 to the gate of which the voltage VREADHH is supplied is kept off.

The level shifters L/S1 and L/S2 have a configuration similar to that shown in FIG. 10 except for the voltage applied to the node CN11 (for the level shifters L/S1 and L/S2, the voltage VBST is applied to the node CN11). That is, the level shifter L/S3 uses the voltage VREADHH as a power supply voltage, and the voltage VREADHH is applied to level shifter L/S3 as a source potential. On the other hand, the level shifters L/S1 and L/S2 use the voltage VBST as a power supply source, and the voltage VBST is applied to the level shifters L/S1 and L/S2 as a source potential. This also applies to the other level shifters described below.

<Details of the SGD Driver 51>

Figure 11:
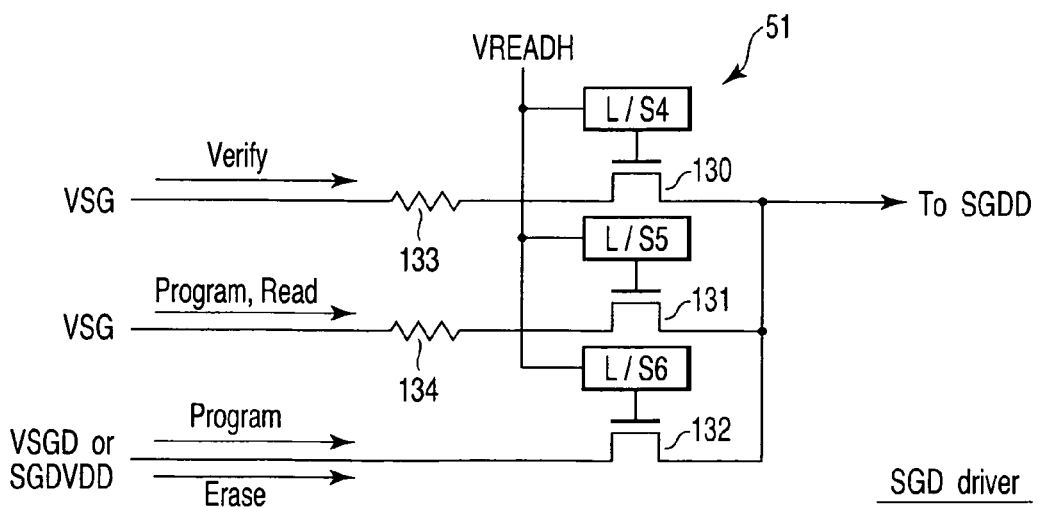
FIG. 11 is a circuit diagram of an SGD driver according to the embodiment of the present invention.

Now, the configuration of the select gate line driver 51 will be described with reference to FIG. 11. FIG. 11 is a circuit diagram of the select gate line driver 51. As shown in the figure, the select gate line driver 51 includes n-channel MOS transistors 130 to 132, resistance elements 133 and 134, and level shifters L/S4 to L/S6.

The MOS transistor 130 has a gate to which an output signal from the level shifter L/S4 is input. The MOS transistor 130 has a current path with one end to which the voltage VSG is applied via the resistance element 133 and other end connected to the corresponding signal line SGDD.

The MOS transistor 131 has a gate to which an output signal from the level shifter L/S5 is input. The MOS transistor 131 has a current path with one end to which the voltage VSG is applied via the resistance element 134 and a second end connected to the corresponding signal line SGDD.

The MOS transistor 132 has a gate to which an output signal from the level shifter L/S6 is input. The MOS transistor 132 has a current path with one end to which the voltage VSGD or SGDVDD is applied and other end connected to the corresponding signal line SGDD.

The level shifters L/S4 to L/S6 are selected in accordance with the result of decoding of a page address to output a signal with the converted voltage VREADH level. That is, in the configuration described in FIG. 10, the voltage VREADH is used as a power supply potential (the source potential or the potential of the node CN11). The voltages VSG, VSGD, and SGDVDD are provided by, for example, the voltage generator group 60. The select gate line driver 51 configured as described above turns on one of the MOS transistors 130 to 132.

That is, for programming, the MOS transistor 131 or 132 is turned on to transfer the voltage VSG or VSGD to the signal line SGDD. For reading, the MOS transistor 131 is turned on to transfer the voltage VSG to the signal line SGDD. For erasure, the MOS transistor 132 is turned on to transfer the voltage SGDVDD to the signal line SGDD. For data verification, the MOS transistor 130 is turned on to transfer the voltage VSG to the signal line SGDD.

<Details of the SGS Driver 52>

Figures 12, 13:
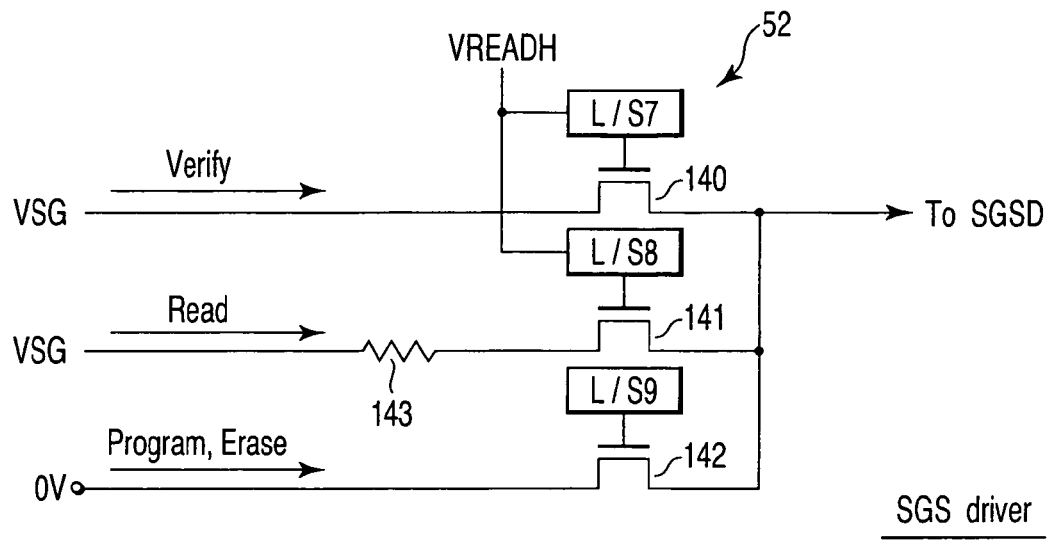
FIG. 12 is a circuit diagram of an SGS driver according to the embodiment of the present invention.
FIG. 13 is a diagram showing voltages applied to word lines for programming and reading in the flash memory according to the embodiment of the present invention.

Now, the configuration of the select gate driver 52 will be described with reference to FIG. 12. FIG. 12 is a circuit diagram of the select gate driver 52. As shown in FIG. 12, the select gate driver 52 includes n-channel MOS transistors 140 to 142, a resistance element 143, and level shifters L/S7 to L/S9.

The MOS transistor 140 has a gate to which an output signal from the level shifter L/S7 is input. The MOS transistor 140 has a current path with one end to which the voltage VSG is applied and other end connected to the corresponding signal line SGSD.

The MOS transistor 141 has a gate to which an output signal from the level shifter L/S8 is input. The MOS transistor 141 has a current path with one end to which the voltage VSG is applied via the resistance element 143 and other end connected to the corresponding signal line SGSD.

The MOS transistor 142 has a gate to which an output signal from the level shifter L/S9 is input. The MOS transistor 142 has a current path with one end to which 0 V is applied and other end connected to the corresponding signal line SGSD.

The level shifters L/S7 to L/S9 are selected in accordance with the result of decoding of a page address. The level shifters L/S7 and L/S8 output a signal with the converted voltage VREADH level. The voltage VSG is provided by, for example, the voltage generator group 60. The select gate line driver 52 configured as described above turns on one of the MOS transistors 140 to 142.

That is, for reading, the MOS transistor 141 is turned on to transfer the voltage VSG to the signal line SGSD. For erasure, the MOS transistor 142 is turned on to transfer 0 V to the signal line SGDD. For data programming and for data verification, the MOS transistor 140 is turned on to transfer the voltage VSG to the signal line SGSD.

<Voltages Transferred to the Word Line WL>

Now, with reference to FIG. 13, description will be given of voltages applied to the word lines WL by the row decoder 40 and the word line driver 53. FIG. 13 is a table showing the voltages to the selected word line WL and the unselected word lines WL for data programming and for reading.

First, the voltages applied for programming will be described. As shown in FIG. 13, the voltage VPGM is applied to the selected word line WLi (i: one of 0 to 31). That is, the word line driver 53 corresponding to the word line WLi turns on the MOS transistors 121 and 125. The voltage VPASS is applied to the unselected word lines WL0 to WL(i−1) and WL(i+1) to WL31. That is, the word line driver 53 corresponding to the unselected word lines turns on the MOS transistors 121 and 127.

The voltages applied for reading will be described. As shown in FIG. 13, the voltage VCGR is applied to the selected word line WLi. That is, the word line driver 53 corresponding to the word line WLi turns on the MOS transistors 121 and 127. The voltage VREADLA is applied to an unselected word line WL(i+1) located adjacent to the selected word line WLi and closer to the select gate line SGD. That is, the word line driver 53 corresponding to the word line WL(i+1) turns on the MOS transistor 123. The voltage VREAD is applied to the other unselected word lines WL. That is, the word line driver 53 turns on the MOS transistor 122.

<Details of the Well Driver 100>

Now, the configuration of the well driver 100 will be described with reference to FIG. 14. FIG. 14 is a circuit diagram of the well driver 100. As shown in the figure, well driver 100 includes n-channel MOS transistors 150 and 151 and level shifters L/S10 and L/S11.

The MOS transistor 150 has a gate to which an output signal from the level shifter L/S10 is input. The MOS transistor 150 has a current path with one end to which the voltage VSS (for example, 0 V) is applied and other end electrically connected to the p-well region 202.

The MOS transistor 151 has a gate to which an output signal from the level shifter L/S11 is input. The MOS transistor 151 has a current path with one end to which the voltage VERA is applied and other end electrically connected to the p-well region 202.

The level shifters L/S10 and L/S11 output a signal with the converted voltage VREADH level. For programming and reading, the level shifter L/S10 outputs an "H" level signal of the VREADH level. For erasure, the level shifter L/S11 outputs an "H" level signal of the VREADH level.

That is, for programming and for reading, the MOS transistor 150 is turned on to provide the voltage VSS to the p-well region 202. For erasure, the MOS transistor 151 is turned on to provide VERA to the well region 202. The voltage VERA is a high positive voltage provided by the voltage generator group 60, for example, 20 V.

<Details of the Source Line Driver 90>

Now, the configuration of the source line driver 90 will be described with reference to FIG. 15. FIG. 15 is a circuit diagram of the source line driver 90. As shown in the figure, the source line driver 90 includes n-channel MOS transistors 160 and 161 and level shifters L/S12 and L/S13.

The MOS transistor 160 has a gate to which an output signal from the level shifter L/S12 is input. The MOS transistor 160 has a current path with one end to which the voltage VSS (for example, 0 V) is applied and other end connected to the source line SL.

The MOS transistor 161 has a gate to which an output signal from the level shifter L/S13 is input. The MOS transistor 161 has a current path with one end to which the voltage VDD is applied and other end connected to the source line SL.

The level shifters L/S12 and L/S13 output a signal with the converted voltage VREADH level. For reading, the level shifter L/S12 outputs the "H" level signal of the VREADH level. For programming, the level shifter L/S13 outputs the "H" level signal of the VREADH level.

That is, for reading, the MOS transistor 160 is turned on to provide the voltage VSS to the source line SL. For programming, the MOS transistor 161 is turned on to provide VDD to the source line SL. For erasure, the MOS transistors 160 and 161 are turned off.

<Details of the Column Selector 20>

Figures 16, 17:
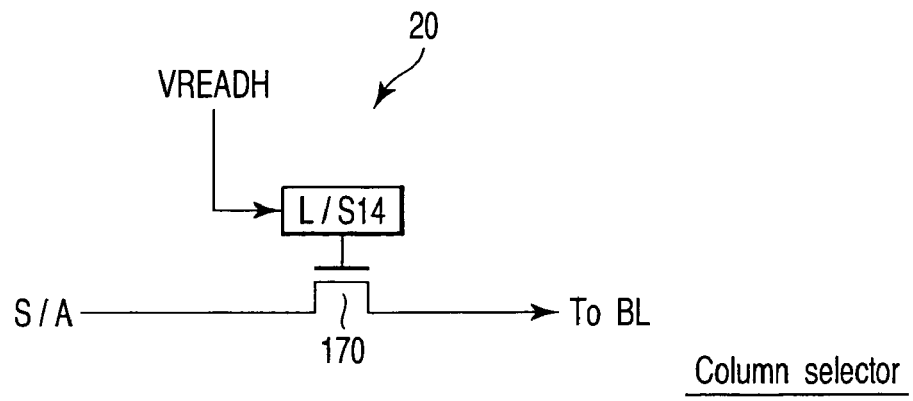
FIG. 16 is a circuit diagram of a column selector according to the embodiment of the present invention.
FIG. 17 is a diagram showing voltages applied to a word line and a select gate line for programming in the flash memory according to the embodiment of the present invention.

Now, the configuration of the column selector 20 will be described with reference to FIG. 16. FIG. 16 is a circuit diagram of the column selector 20. As shown in the figure, the column selector 20 includes an n-channel MOS transistor 170 and a level shifter L/S14.

The MOS transistor 170 has a gate to which an output signal from the level shifter L/S14 is input. The MOS transistor 170 has a current path with one end connected to one of the bit ends BL and other end connected to the sense amplifier 30.

The level shifter L/S14 outputs the signal with the converted voltage VREADH level. For reading, the level shifter L/S14 outputs the "H" level signal to turn on the MOS transistor 170 and to connect the bit line BL and the sense amplifier 30 together.

<Operation of the NAND Flash Memory>

Now, description will be given below of a data programming operation and a data reading operation performed by the NAND flash memory configured as described above, focusing on the voltages applied to the word line WL and the select gate lines SGD and SGS.

<Programming Operation>

First, the programming operation will be described. The case where charges are injected into the charge accumulation layer to raise the threshold voltage of the memory cell transistor MT is called "0" programming. On the other hand, the case where the injection of charges into the charge accumulation layer is avoided to avoid changing the threshold voltage (in other words, the amount of charges injected is limited to the range within which held data is prevented from changing to a different level) is called "1" programming. FIG. 17 is a table showing the voltages applied to the select gate lines SGS and SGD and the word lines WL0 to WL31.

As shown in FIG. 17, the voltage VSGD is applied to the select gate line SGD, and 0 V is applied to the select gate line SGS. The voltage VPGM is applied to the selected word line WLi, and the voltage VPASS is applied to the other, unselected word lines WL0 to WL(i−1) and WL(i+1) to WL31.

The voltage VPGM is a high voltage required to inject charges into the charge accumulation layer, for example 20 V. The voltage VPASS enables the memory cell transistor MT to be turned on regardless of the held data. The relationship between the voltages VPGM and VPASS is VPGM>VPASS. The voltage VSGD allows the select transistor ST1 to transfer "0" programming data, while avoiding transferring "1" programming data. In other words, for the "0" programming, the select transistor ST1 is turned on. For the "1" programming, the select transistor ST1 is cut off.

As a result, the memory cell transistors MT0 to MT31 are turned on to form channels. That is, current paths are formed through the memory cell transistors MT0 to MT31 in the memory cell unit 11 and energized. Furthermore, since 0 V is applied to the select gate line SGS, the select transistor ST2 is cut off. In contrast, the select transistor ST1 is turned on or cut off depending on program data.

For the "0" programming, a write voltage (for example, 0 V) is applied to the bit line. Consequently, the select transistor ST1 is turned on to transfer 0 V provided to the bit line to the channels of the memory cell transistors MT0 to MT31. Then, the potential difference between the gate and channel of the memory cell transistor MTi connected to the selected word line WLi becomes almost equal to VPGM. Charges are thus injected into the charge accumulation layer. As a result, the threshold voltage of the memory cell transistor MTi rises to allow the "0" programming to be performed.

On the other hand, for the "1" programming, a write inhibition voltage Vinhibit (>the write voltage) is applied to the bit line, cutting off the select transistor ST1. This makes the channels of the memory cell transistors MT0 to MT31 in the memory cell unit electrically floating. Then, the potential of the channel of each of the memory cell transistors MT0 to MT31 is raised by coupling with the gate potential (VPGM, VPASS). Thus, the potential difference between the gate and channel of the memory cell transistor MTi connected to the selected word line WLi is insufficient. This prevents charges from being injected into the charge accumulation layer (the amount of charges injected is insufficient to change the held data). As a result, the threshold voltage of the memory cell transistor MTi remains unchanged. The "1" programming is thus performed. Similarly, for the memory cell transistors MT0 to MT(i−1) and MT(i+1) to MT31 connected to the unselected word lines WL0 to WL(i−1) and WL(i+1) to WL31, the potential difference between the gate and channel is small, preventing charges from being injected into the charge accumulation layer.

<Reading Operation>

Figure 18:
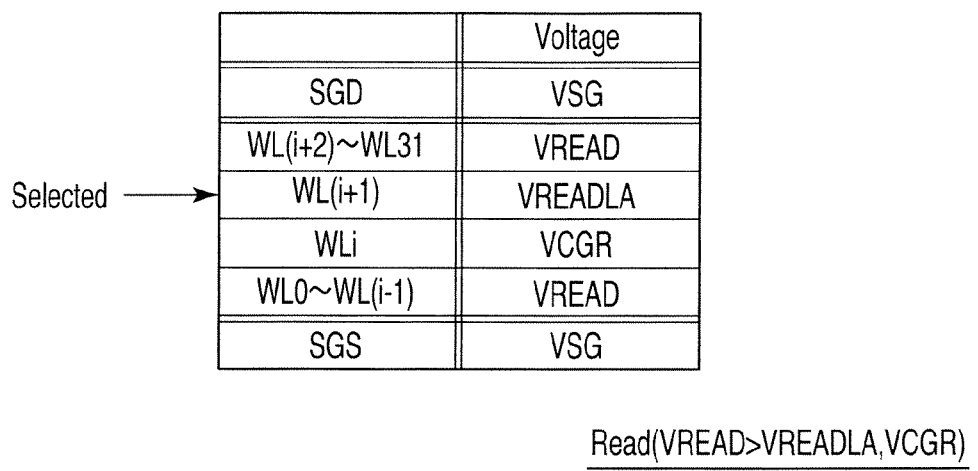
FIG. 18 is a diagram showing voltages applied to the word line and select gate line for reading in the flash memory according to the embodiment of the present invention.

Now, the data reading operation will be described. FIG. 18 is a table showing the voltages applied to the select gate lines SGS and SGD and the word lines WL0 to WL31.

As shown in FIG. 18, the voltage VSG is applied to the select gate lines SGD and SGS. The voltage VCGR is applied to the selected word line WLi. The voltage VREADLA is applied to the unselected word line WL(i+1). The voltage VREAD is applied to the other unselected word lines WL0 to WL(i−1) and WL(i+2) to WL31.

The voltage VREAD allows the memory cell transistor MT to be turned on regardless of the held data. The voltage VCGR is applied to the memory cell transistor to be subjected to reading and varies depending on the data to be read. For example, the voltage VCGR is set to V01 to read "0" data and to V12 to read "1" data. The voltage VREAD is higher than the voltage VCGR. The voltage VREADLA varies depending on the data in the memory cell transistor MT(i+1) and allows the memory cell transistor MT(i+1) to be turned on. The voltage VREAD is higher than the voltage VREADLA. The voltage VSG allows the select transistors ST1 and ST2 to be turned on.

As a result, the select transistors ST1 and ST2 and the unselected memory cell transistors MT0 to MT(i−1) and MT(i+1) to MT31 are turned on. When the memory cell transistor MTi holds data corresponding to a threshold voltage lower than the voltage VCGR, the above-described transistors are turned on, and the voltage of the bit line is dropped. When the memory cell transistor MTi holds data corresponding to a threshold voltage equal to or higher than the voltage VCGR, the above-described transistors are turned off, and the voltage of the bit line maintains a precharge potential. Data reading is thus performed by the sense amplifier 30 by sensing and amplifying a change in the potential of the bit line.

Figure 19:
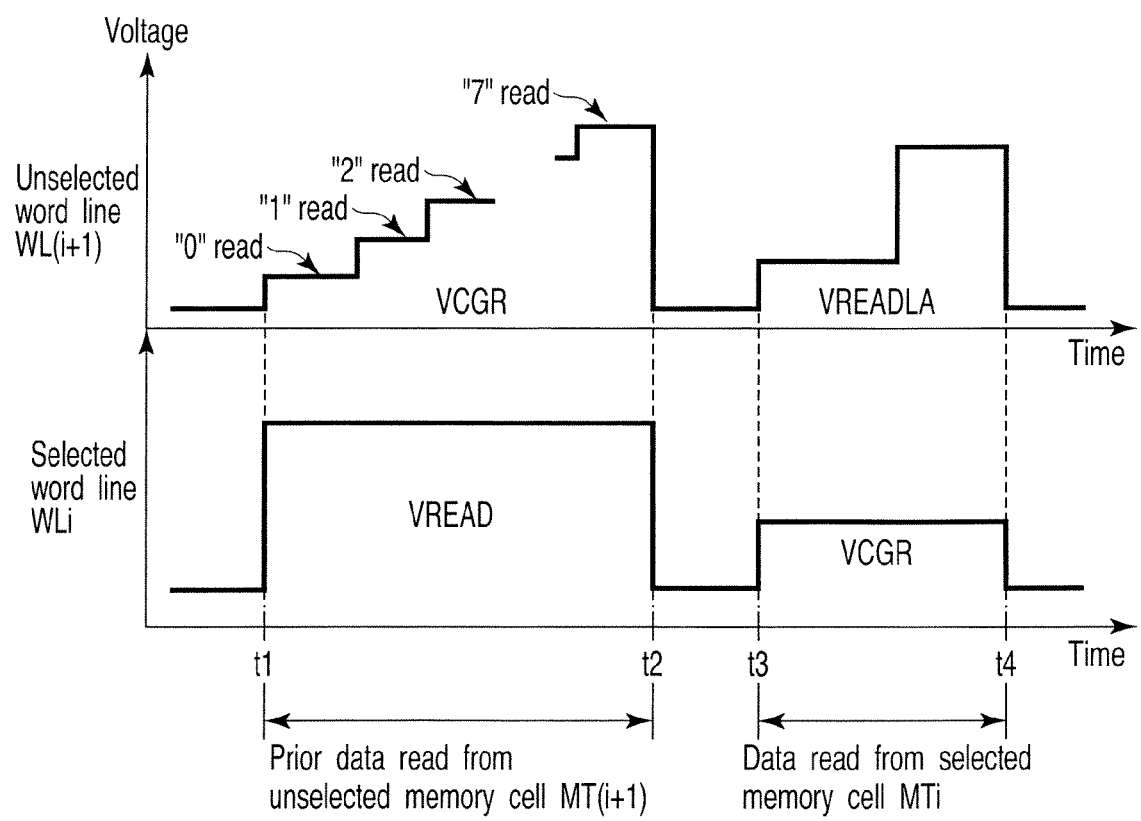
FIG. 19 is a timing chart showing voltages applied to the word line for reading in the flash memory according to the embodiment of the present invention.

The details of the reading operation will be described with reference to FIG. 19. FIG. 19 is a timing chart of the potentials of the selected word line WLi and the unselected word line WL(i+1) observed during data reading.

As shown in FIG. 19, the data reading includes a first reading step executed between a time t1 and a time t2 and a second reading step executed between a time t3 and a time t4.

In the first reading step, data is read from the unselected memory cell transistor (i+1) connected to the unselected word line WL(i+1) positioned closer to the drain than the selected word line WLi. This is performed in order to determine what effect the coupling between the floating gates has on the selected memory cell transistor MTi (this effect is hereinafter referred to as a coupling effect). That is, the memory cell transistor MT may apparently have a high threshold voltage owing to the effect of the adjacent memory cell transistor MT. The effect varies depending on the data held by the adjacent memory cell transistor MT. Thus, during the first reading step, the unselected memory cell transistor MT(i+1) is subjected to reading to pre-check the data held by the memory cell transistor MT(i+1). To achieve this, the first reading step applies the voltage VREAD to the selected word line WLi, while applying the voltage VCGR to the unselected word line WL(i+1). The voltage VCGR varies among 8 levels depending on 8-level data. At each of the 8 levels, one of "0" to "7" data is read.

Then, in the second step, data is read from the selected memory cell transistor MTi connected to the selected word line WLi. That is, the voltage VCGR is applied to the selected word line WLi, whereas the voltage VREADLA is applied to the unselected word line WL(i+1). The value of the voltage VREADLA varies depending on the data read from the memory cell transistor MT(i+1) during the first reading step. The voltage shown in FIG. 18 is used for the second reading step.

<Effects>

As described above, the semiconductor memory device according to the embodiment of the present invention enables a reduction in a load on the charge pump circuit in the voltage generator group 60. This allows the reliability of the NAND flash memory to be improved, while minimizing an increase in circuit area. This effect will be described below.

In the conventional NAND flash memory, various voltages are applied to the word line WL in order to optimize data programming and reading characteristics. For example, for reading, the voltage VREAD is applied to the unselected word line. Furthermore, another voltage (in the conventional art, VREADH) is required to transfer the voltage VREAD to the word line WL. The voltages VREAD and VREADH are generated by respective independent voltage generators.

In recent years, the voltage VREAD has been demanded to be high. For example, two possible reasons for this demand are as follows.

(1) Miniaturization of NAND flash memories degrades data retention characteristics. Thus, the threshold distribution is set to higher voltage levels, requiring an increase in voltage VREAD.

(2) The threshold distribution is expanded depending on back pattern dependence. To inhibit this, it is effective to increase the voltage VREAD.

The reason (1) will be explained with reference to FIG. 20. FIG. 20 is a graph showing the threshold distribution of a memory cell transistor MT holding 4-level data and the threshold distribution of a memory cell transistor MT holding 8-level data.

As shown in FIG. 20, for the memory cell transistor MT holding 4-level data, the threshold voltage of "3" data having a higher threshold is at least about V23=3.5 V. Consequently, the required voltage VREAD is about V23+2V=5.5 V, at most about 6 V.

Then, the voltage VREADH for conventional 4-level NAND flash memories needs to be, for example, about 8 V. This is because the voltage VREADH needs to turn on a MOS transistor transferring the voltage VREAD of 6 V. That is, the voltage VREADH needs to be higher than the voltage VREAD by at least an amount equal to the threshold of the MOS transistor transferring the voltage VREAD.

On the other hand, for the memory cell transistor MT holding 8-level data, the threshold voltage of "7" data having the highest threshold is at least V67=5.5 V. Consequently, the required voltage VREAD is about V67+2V=7.5 V.

Thus, the voltage VREAD needs to be increased consistently with the number of data bits held by the memory cell transistor MT. For example, if 16-level data is held by the memory cell transistor MT, the voltage VREAD needs to be further increased.

Thus, to meet the above-described demand, it is necessary to increase the voltage VREAD generated by the voltage generator. However, simply increasing the voltage generated by the voltage generator disadvantageously uselessly increases the load on the voltage generator. This will be explained below.

The application of the voltage VREADH is not limited to the transfer of the voltage VREAD. That is, the voltage VREADH is used for a driver circuit for source lines or wells, a row driver circuit transferring voltages other than the voltage VREAD, and the like. The voltage VREADH is also used for a control circuit for a gate of a switching MOS transistor connecting the sense amplifier and the bit line together. This circuit is used to reduce the rising speed of the voltage of the bit line during charging.

These circuits do not necessarily require a high voltage even with a rise in voltage VREAD. It is assumed that when the voltage VREAD rises, for example, from 6 V to 8 V, the voltage VREADH is raised from 8 V to 10 V. This raise is to meet the demand for the driver transferring the voltage VREAD. However, other circuits can operate sufficiently with the voltage VREADH of 8 V. Raising the voltage from 8 V to 10 V is useless for these circuits.

Even through the raise is useless, the raise in voltage generated increases the amount of charges required and thus the load on the charge pump circuit. This requires an increase in the circuit area of the charge pump circuit.

However, the configuration according to the present embodiment uses the new voltage VREADHH (>VREADH) to transfer the voltage VREAD, besides the voltage VREADH, used for the other circuits. Consequently, the high voltage VREADHH is supplied only to the circuits requiring a high voltage. The voltage VREADH is supplied to the circuits not requiring a high voltage as in the case of the conventional art. This prevents the high voltage from being uselessly used.

Furthermore, the voltage VREADH is generated by using the diode 69 to drop the new voltage VREADHH. That is, the voltages VREADHH and VREADH share the charge pump circuit 67 (see FIG. 5). This eliminates the need to provide a new charge pump circuit, preventing an increase in circuit area.

Moreover, as shown in FIG. 5, although the charge pump circuit 67 generates the voltage VREADHH, the node N3 outputs the voltage VREADH to the load. Thus, compared to the technique of supplying the voltage VREADHH to all the circuit blocks, the present technique requires the reduced amount of charges. This makes it possible to reduce the load on the charge pump circuit 67, which generates the high voltage VREADHH. That is, an increase in the size of the charge pump circuit 67 can be inhibited. According to the present embodiment, the limiter 68 monitors the potential of the node N3.

Moreover, in the present embodiment, the size of the MOS transistor 69 forming a diode is the same as that of the MOS transistor (the MOS transistor 43, 46, 122, or the like) transferring the voltage VREAD. More specifically, the two MOS transistors have the same gate length and/or gate width. That is, the two MOS transistors have the same threshold voltage Vth. Then, the voltage VREADHH is (VREADH+Vth)=(8V+Vth), and the voltage VREAD is at most about 8 V (=VREADH). Consequently, when the limiter 68 maintains the potential of the node N3 at VREADH, the voltage VREADHH output by the node N2 makes it possible to turn on the MOS transistor that is to transfer the voltage VREAD. Therefore, the above-described configuration facilitates the design of the row circuit and voltage generator in the NAND flash memory.

The semiconductor memory device according to the present embodiment can be roughly described as follows. FIG. 21 is a block diagram of a partial area of the NAND flash memory according to the abode-described embodiment. The NAND flash memory 1 includes the memory cell unit 11 (not shown), the word line WL, a driver circuit 170, the voltage generator 63, and circuit blocks 180 other than the driver circuit.

The driver circuit 170 includes a first MOS transistor 171 and a level shifter 172. For data reading, the first MOS transistor 171 transfers the voltage VREAD to the unselected word line. The level shifter 172 uses the first voltage VREADHH output by the voltage generator 63 to generate a gate voltage for the first MOS transistor 171. In other words, the first voltage VREADHH is used as a source voltage, that is, a power supply voltage for the level shifter 171. The first MOS transistor 171 corresponds to the MOS transistors 43 and 126, described above. The level shifter 172 corresponds to the voltage driver 80, described above.

Each of the circuit blocks 180 includes a MOS transistor 181 which transfers a voltage to each of the select gate line, the source line, and the well region 202 or which connects the bit line BL to the sense amplifier 30, and a level shifter 182. The level shifter 182 uses the second voltage VREADH output by the voltage generator 63 to generate a gate voltage for the MOS transistor 181. That is, the second voltage VREADH is used as a source voltage, that is, a power supply voltage for the level shifter 182. That is, the circuit block 180 corresponds to the select gate line drivers 51 and 52, the source line driver 90, the well driver 100, or the column selector 20.

The voltage generator 63 includes a pump circuit 67, a semiconductor element 69, and a limiter circuit 68. The pump circuit 67 generates and outputs the first voltage VREADHH to the node N2. The semiconductor element 69 functions as a diode to drop the first voltage VREADHH to output the second voltage VREADH to the node N3. The limiter circuit 68 monitors the potential of the node N3 and controls the operation of the pump circuit 67 in accordance with the potential of the node N3.

In the above-described configuration, the semiconductor element 69 is a diode-connected MOS transistor and has the same size as that of the MOS transistor 171. That is, the semiconductor element 69 and the MOS transistor 171 have similar threshold voltages. The semiconductor element 69 may be formed of a set of a plurality of MOS transistors having the same size.

The embodiment according to the present invention is not limited to the one described above but can be varied. For example, in the above description, the voltage VREADHH is used to transfer the voltage VREAD. However, of course, the voltage VREADHH may be used to transfer any other voltage. That is, as shown in FIG. 9, the voltage VREADHH may be used to transfer the voltage VCGR. Furthermore, like the voltage VREAD, the voltage VREADHH may be used to transfer the voltage VPASS, which is required to turn on the memory cell transistor MT.

Moreover, in the 8-level NAND flash memory described above in the embodiment, each of the memory cell transistors MT can hold 3-bit data by way of example. However, the embodiment is applicable to, for example, a 2-level NAND flash memory, 4-level NAND flash memory, or 16-level NAND flash memory. However, an increase in the number of held data bits makes the effects of the embodiment more significant. Moreover, in addition to being applicable to the NAND flash memory, the above embodiment is widely applicable to semiconductor devices in general, which disadvantageously require high voltages to transfer signals.

Figure 22:
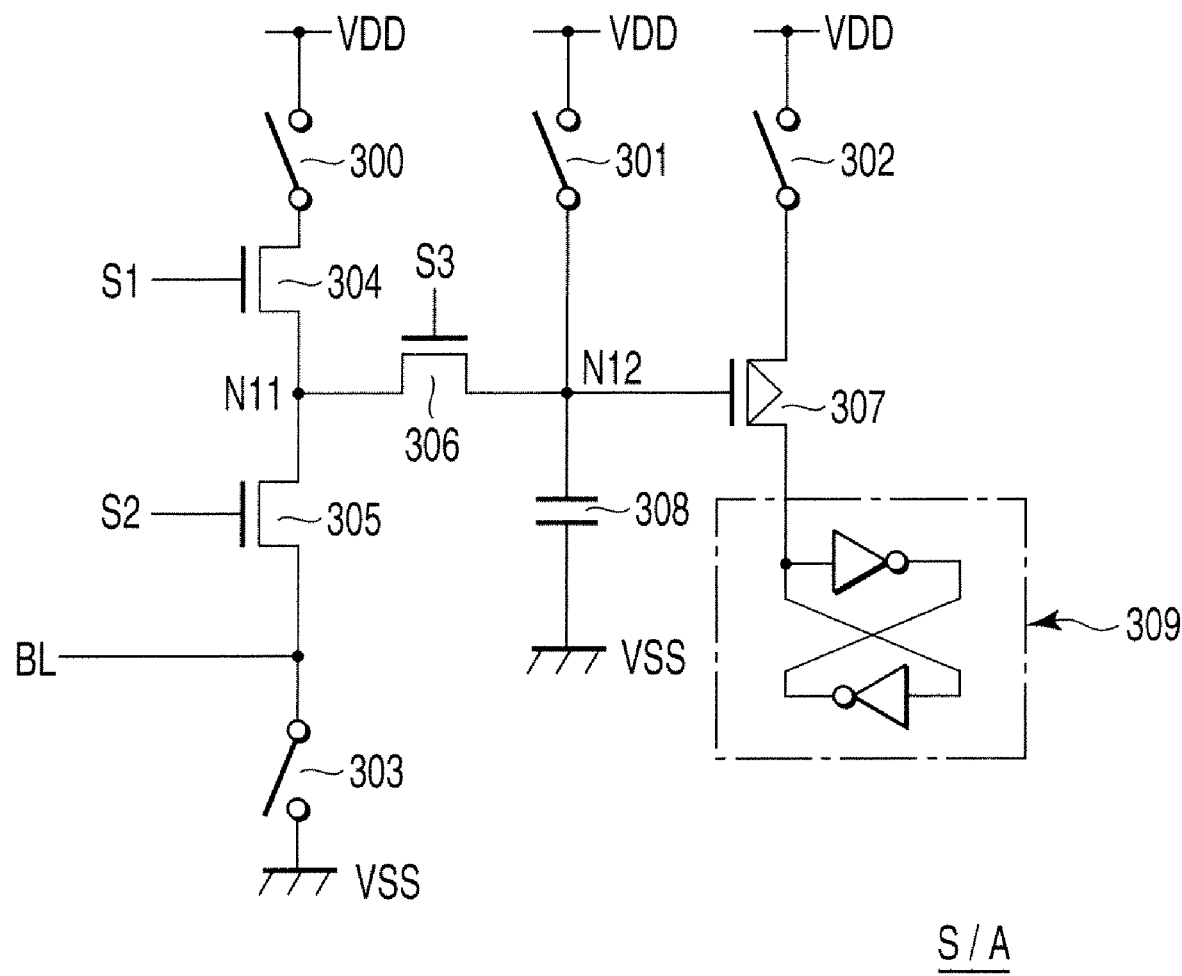
FIG. 22 is a circuit diagram of a sense amplifier provided in the flash memory according to the embodiment of the present invention.

Although not described above in detail, the sense amplifier 30 may sense either voltage or current. FIG. 22 is a circuit diagram of the sense amplifier 30 sensing current.

As shown in FIG. 22, the sense amplifier includes switch elements 300 to 303, n-channel MOS transistors 304 to 306, a p-channel MOS transistor 307, a capacitor element 308, and a latch circuit 309. A current path of the MOS transistor 304 has one end to which the voltage VDD is provided via the switch element 300 and other end connected to the node N11. A signal S1 is input to a gate of the MOS transistor 304. A current path of the MOS transistor 305 has one end connected to the node N11 and other end connected to the bit line BL and to which the voltage VSS is provided via the switch element 303. A signal S2 is input to a gate of the MOS transistor 305. A current path of the MOS transistor 306 has one end connected to the node N11 and other end connected to the node N12. A signal S3 is input to a gate of the MOS transistor 306. The voltage VDD is provided to the node N12 via the switch element 301. One electrode of the capacitor element 308 is connected to the node N12. The voltage VSS is provided to other electrode of the capacitor element 308. A current path of the MOS transistor 307 has one end to which the voltage VDD is provided via the switch element 302 and other end connected to the latch circuit 309. A gate of the MOS transistor 307 is connected to the node N12.

A brief description will be given of a data sensing method executed by the above-described configuration. It is assumed that the memory cell is programmed to "1". First, the switch element 300 and the MOS transistors 304, 305, and 306 are turned on. The bit line BL is precharged to about 0.65 V, and the potentials of the nodes N11 and N12 are precharged to 0.9 V and 2.5 V, respectively. That is, since the memory cell transistor MT is on, the nodes are precharged with current passed through the bit line BL.

Then, the switch element 301 is turned off. Current flowing from the node N12 to the bit line BL discharges the node N12, the potential of which becomes about 0.9 V. The current flowing through the bit line BL sets the potential of the node N11 equal to or lower than 0.9 V. However, the MOS transistor 304 provides a current supply to maintain the potential of the node N11 at 0.9 V.

Since the potential of the node N 12 is 0.9 V, the MOS transistor 307 is turned on. Thus, the latch circuit 309 holds the voltage VDD. Since the latch circuit 309 holds the voltage VDD, the switch element 300 is turned off, and the switch element 303 is turned on. The potential of the node N12 is set to 0 V. As a result, the latch circuit 309 continuously holds the voltage VDD.

Now, description will be given of the case in which the selected memory cell is programmed to "0". In this case, the potential of the node N12 is maintained at about 2.5 V. Consequently, the MOS transistor 307 is turned off, and the latch circuit 309 holds the voltage VSS (0 V). Thus, the switch element 300 is turned on, and the switch element 303 is turned off. The potential of the node N12 is maintained at 2.5 V, and the latch circuit 309 continuously holds the voltage VSS.

As described above, the sense amplifier sensing the current flowing through the bit line enables data to be read from all the bit lines at a time without the need to take into account the adverse effect, on each bit line, of a variation in the potential of the adjacent bit line.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell unit including a plurality of memory cells connected in series and each having a charge accumulation layer and a control gate formed on the charge accumulation layer;
   word lines connected to the control gates of the memory cells;
   a first driver circuit which, for data reading, selects one of the word lines and transfers a voltage to a selected word line and an unselected word line; and
   a voltage generator which generates a first voltage and a second voltage which is lower than the first voltage, the first voltage being used by the first driver circuit to transfer the voltage to the unselected word line, the second voltage being used by circuits other than the first driver circuit,
   wherein the voltage generator includes (i) a pump circuit which generates and outputs the first voltage to a first node; (ii) a semiconductor element which drops the first voltage to output the second voltage to a second node; and (iii) a limiter circuit which monitors a potential of the second node to control an operation of the pump circuit in accordance with the potential of the second node,
   the semiconductor element functions as a diode,
   the first driver circuit includes (i) a first MOS transistor which, for the data reading, transfers a voltage to the unselected word line; and (ii) a level shifter which uses the first voltage to generate a gate voltage for the first MOS transistor,
   the first MOS transistor transfers a voltage which turns on the memory cell regardless of data held in the memory cell, to the unselected word line,
   the semiconductor element is a second MOS transistor having one end of a current path and a gate, which are connected to the first node, and other end of the current path connected to the second node, and
   the second MOS transistor has a same gate length and a same gate width as those of the first MOS transistor.

2. The device according to claim 1, wherein the first voltage is used as a source potential for a p-channel MOS transistor included in the level shifter.

3. The device according to claim 1, wherein the first voltage is higher than the second voltage by an amount equal to a threshold voltage of the second MOS transistor.

4. The device according to claim 1, wherein each of the memory cells is configured to hold data of at least 3 bits.

5. The device according to claim 1, further comprising:
   a bit line electrically connected to a drain of one of the memory cells positioned at one end of the memory cell unit;
   a source line electrically connected to a source of one of the memory cells positioned at a second end of the memory cell unit;
   a sense amplifier which, for the data reading, senses data read to the bit line;
   a second driver circuit which transfers a second voltage to a semiconductor layer in which the memory cells are formed and to the source line; and
   a column selector which connects the bit line and the sense amplifier together,
   wherein the first voltage is used by the first driver circuit to transfer the voltage to the unselected word line, and
   the second voltage is used by the second driver circuit to transfer the second voltage to at least one of the semiconductor layer and the source line and to allow the column selector to connect the bit line and the sense amplifier together.

6. The device according to claim 1, further comprising:
   a bit line electrically connected to a drain of one of the memory cells positioned at one end of the memory cell unit;
   a source line electrically connected to a source of one of the memory cells positioned at a second end of the memory cell unit;
   a sense amplifier which, for the data reading, senses data read to the bit line;
   a second driver circuit which transfers a second voltage to a semiconductor layer in which the memory cells are formed and to the source line; and
   a column selector which connects the bit line and the sense amplifier together,
   wherein the first voltage is used by the first driver circuit to transfer the voltage to the unselected word line, and
   the second voltage is used by the second driver circuit to transfer the second voltage to at least one of the semiconductor layer and the source line or to allow the column selector to connect the bit line and the sense amplifier together.

* * * * *